United States Patent
Zhuang et al.

(10) Patent No.: US 11,469,146 B2
(45) Date of Patent: Oct. 11, 2022

(54) METHODS OF PERFORMING FIN CUT ETCH PROCESSES FOR FINFET SEMICONDUCTOR DEVICES

(71) Applicant: GLOBALFOUNDRIES U.S. Inc., Santa Clara, CA (US)

(72) Inventors: Lei L. Zhuang, Ridgefield, CT (US); Balasubramanian Pranatharthiharan, Watervliet, NY (US); Lars Liebmann, Poughquag, NY (US); Ruilong Xie, Schenectady, NY (US); Terence Hook, Jericho, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 13 days.

(21) Appl. No.: 17/169,918

(22) Filed: Feb. 8, 2021

(65) Prior Publication Data

US 2021/0183709 A1 Jun. 17, 2021

Related U.S. Application Data

(62) Division of application No. 15/899,508, filed on Feb. 20, 2018, now Pat. No. 10,916,478.

(51) Int. Cl.
*H01L 21/8238* (2006.01)
*H01L 27/092* (2006.01)
(Continued)

(52) U.S. Cl.
CPC ........... *H01L 21/823821* (2013.01); *H01L 21/823481* (2013.01); *H01L 21/823814* (2013.01);
(Continued)

(58) Field of Classification Search
CPC ..... H01L 21/823431; H01L 21/823481; H01L 27/0886; H01L 21/823821; H01L 21/823814; H01L 21/823878; H01L 29/0847; H01L 29/66545; H01L 27/0924; H01L 29/0653; H01L 29/7848; H01L 27/1104; H01L 27/0203; H01L 21/823828; H01L 27/092; H01L 21/823437; H01L 27/088; H01L 21/823857;
(Continued)

(56) References Cited

U.S. PATENT DOCUMENTS 8,003,466 B2 8/2011 Shi et al.
8,569,152 B1 10/2013 Basker et al.
(Continued)

OTHER PUBLICATIONS

Office Action and English Translation thereof for corresponding TW Patent Application No. 10721162020 dated Dec. 10, 2018, 9 pages.
(Continued)

*Primary Examiner* — Mouloucoulaye Inoussa
(74) *Attorney, Agent, or Firm* — David Cain; Hoffman Warnick LLC

(57) ABSTRACT

In a self-aligned fin cut process for fabricating integrated circuits, a sacrificial gate or an epitaxially-formed source/drain region is used as an etch mask in conjunction with a fin cut etch step to remove unwanted portions of the fins. The process eliminates use of a lithographically-defined etch mask to cut the fins, which enables precise and accurate alignment of the fin cut.

9 Claims, 21 Drawing Sheets

(51) Int. Cl.
| | |
|---|---|
| *H01L 29/06* | (2006.01) |
| *H01L 29/08* | (2006.01) |
| *H01L 29/66* | (2006.01) |
| *H01L 21/8234* | (2006.01) |
| *H01L 29/78* | (2006.01) |
| *H01L 27/11* | (2006.01) |

(52) U.S. Cl.
CPC .. *H01L 21/823878* (2013.01); *H01L 27/0924* (2013.01); *H01L 29/0653* (2013.01); *H01L 29/0847* (2013.01); *H01L 29/66545* (2013.01); *H01L 27/1104* (2013.01); *H01L 29/7848* (2013.01)

(58) Field of Classification Search
CPC ............. H01L 21/823462; H01L 27/04; H01L 21/82345; H01L 29/42364; H01L 29/517; H01L 27/02; H01L 27/0922; H01L 21/823871; H01L 27/0207; H01L 29/41791; H01L 21/76834; H01L 21/28; H01L 21/28008; H01L 29/165; H01L 29/66628; H01L 29/45; H01L 21/76897; H01L 29/66575; H01L 21/7682; H01L 21/76832; H01L 29/401; H01L 29/41775; H01L 29/66636; H01L 29/41783; H01L 21/31144; H01L 21/76224; H01L 29/6656; H01L 29/785; H01L 29/0649; H01L 21/764
USPC .................. 438/585, 586, 430; 257/288, 401
See application file for complete search history.

(56) References Cited

U.S. PATENT DOCUMENTS

| | | | |
|---|---|---|---|
| 8,609,510 B1* | 12/2013 | Banna | H01L 21/823431 257/E21.409 |
| 9,362,181 B1 | 6/2016 | Xie et al. | |
| 9,564,369 B1* | 2/2017 | Kim | H01L 21/823437 |
| 9,761,495 B1* | 9/2017 | Xie | H01L 21/823481 |
| 9,818,875 B1* | 11/2017 | Bi | H01L 29/7851 |
| 2011/0193167 A1 | 8/2011 | Fung et al. | |
| 2013/0140639 A1* | 6/2013 | Shieh | H01L 21/823418 438/296 |
| 2014/0103452 A1 | 4/2014 | Chang et al. | |
| 2016/0111524 A1 | 4/2016 | Ha et al. | |
| 2016/0268414 A1 | 9/2016 | Park et al. | |
| 2016/0336315 A1 | 11/2016 | You et al. | |
| 2017/0040162 A1 | 2/2017 | Smith et al. | |
| 2017/0053980 A1* | 2/2017 | Liou | H01L 21/31144 |
| 2017/0117187 A1* | 4/2017 | Ando | H01L 29/66545 |
| 2017/0141211 A1* | 5/2017 | Xie | H01L 21/76224 |
| 2018/0040694 A1* | 2/2018 | Tseng | H01L 29/66795 |
| 2018/0233557 A1* | 8/2018 | Cheng | H01L 29/401 |

OTHER PUBLICATIONS

Non Final Office Action dated Mar. 12, 2020 for U.S. Appl. No. 15/899,508, filed Feb. 20, 2018; p. 28.
Final Office Action dated Jun. 30, 2020 for U.S. Appl. No. 15/899,508, filed Feb. 20, 2018; p. 16.
Notice of Allowance and Fee(s) Due dated Oct. 30, 2020 for U.S. Appl. No. 15/899,508, filed Feb. 20, 2018; p. 7.

* cited by examiner

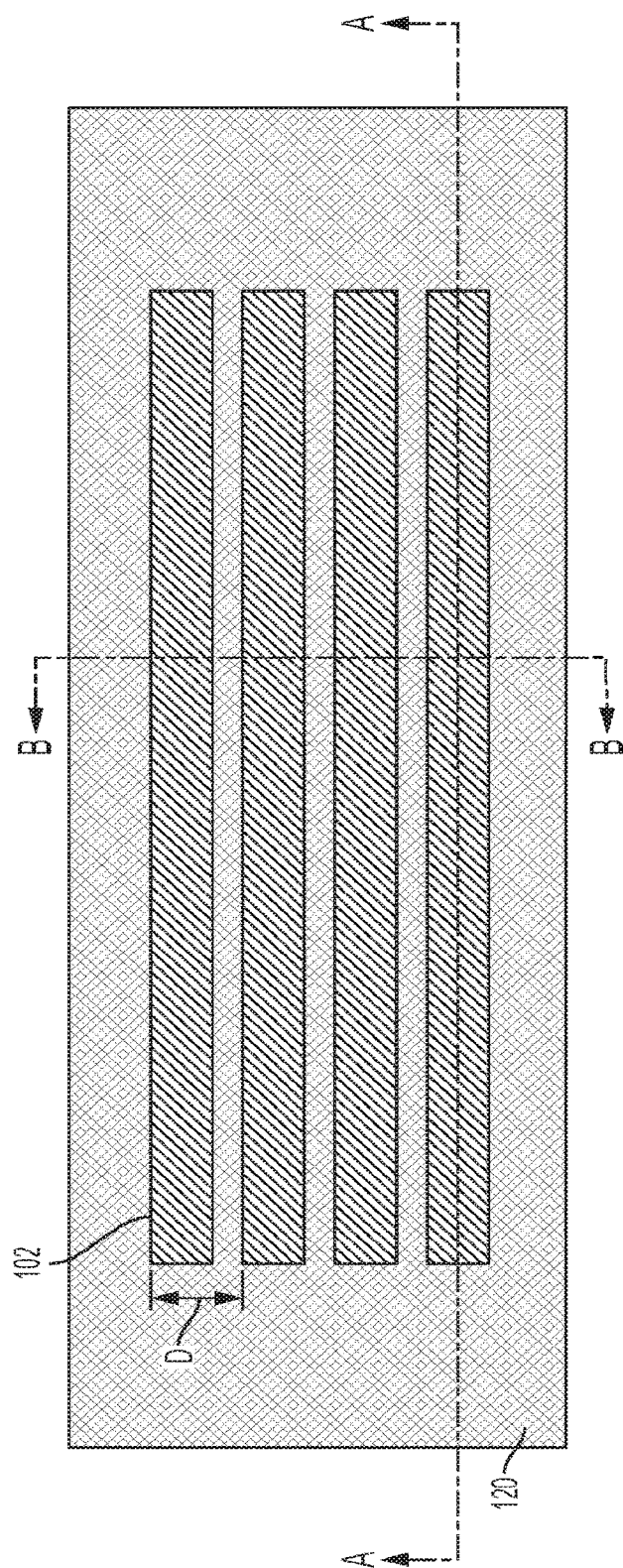
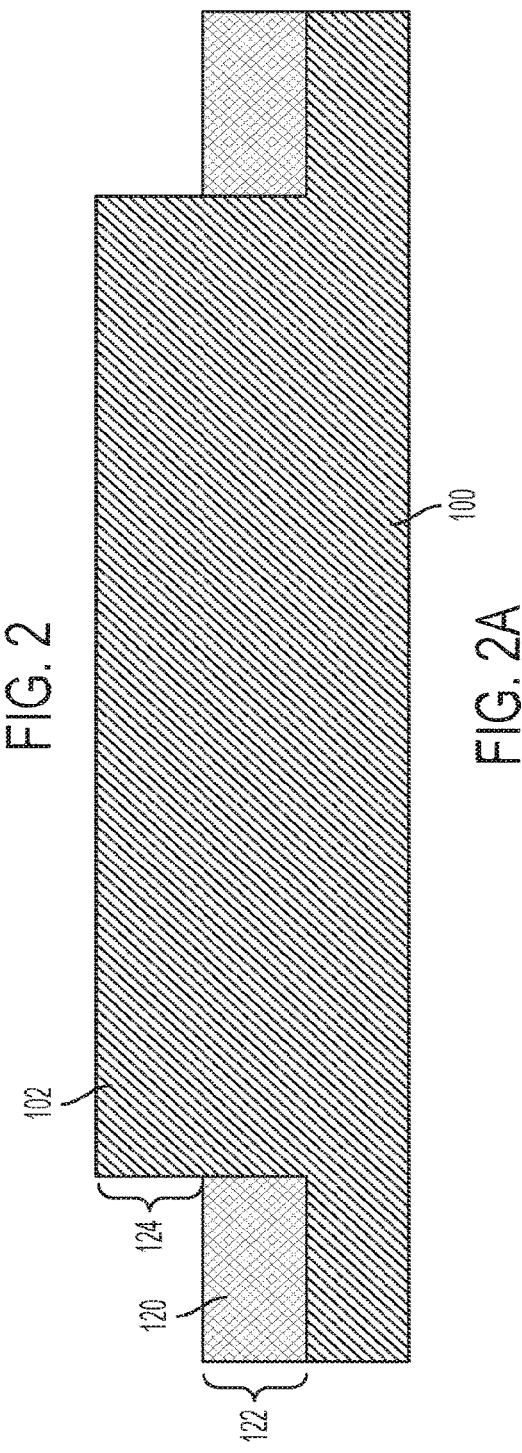
FIG. 2
FIG. 2A

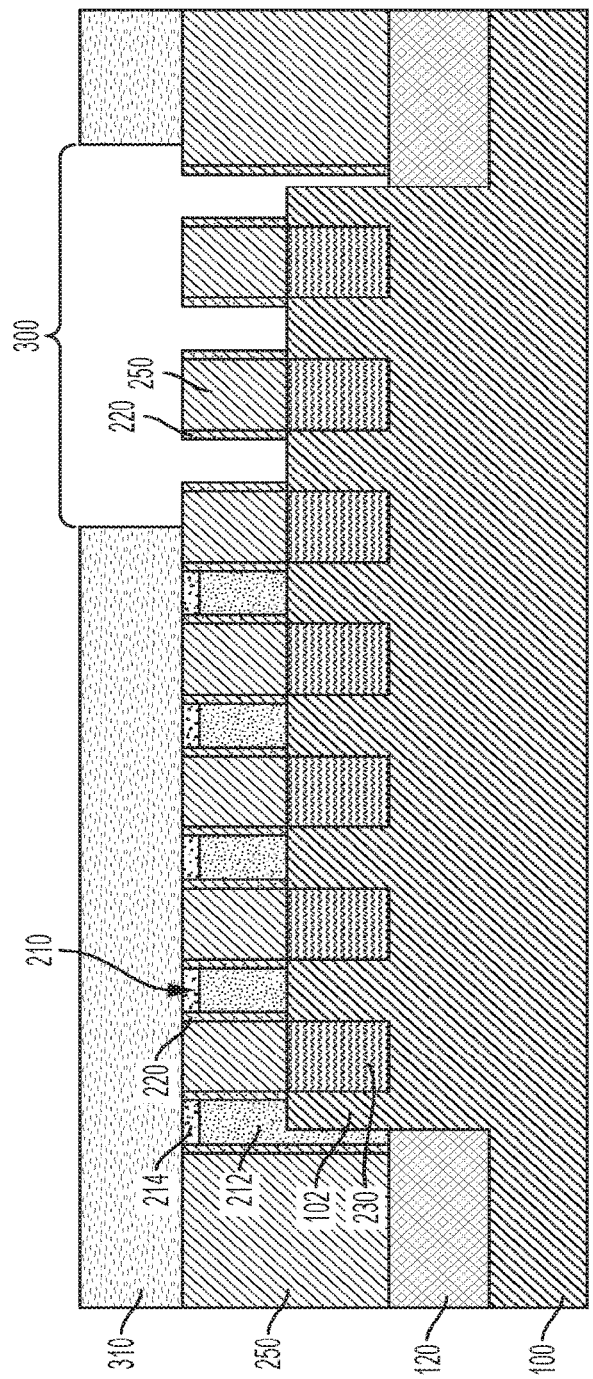
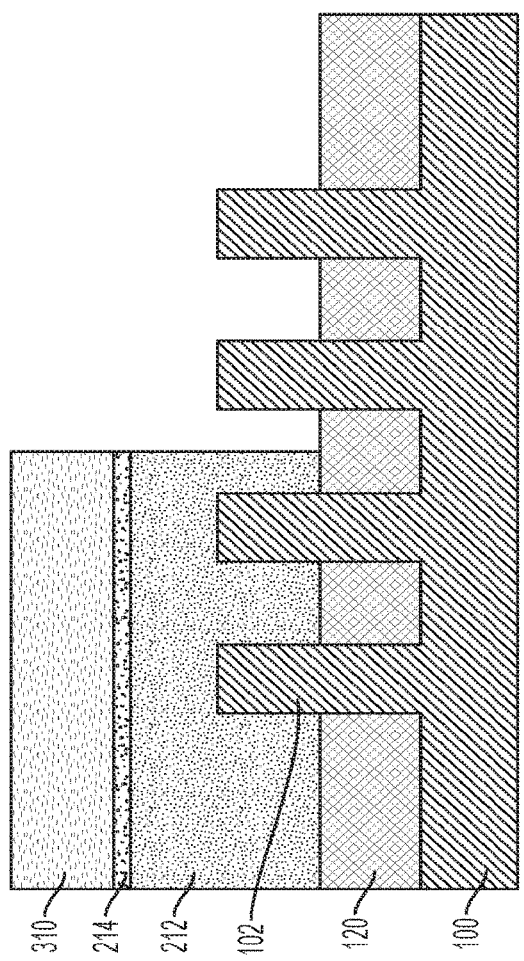

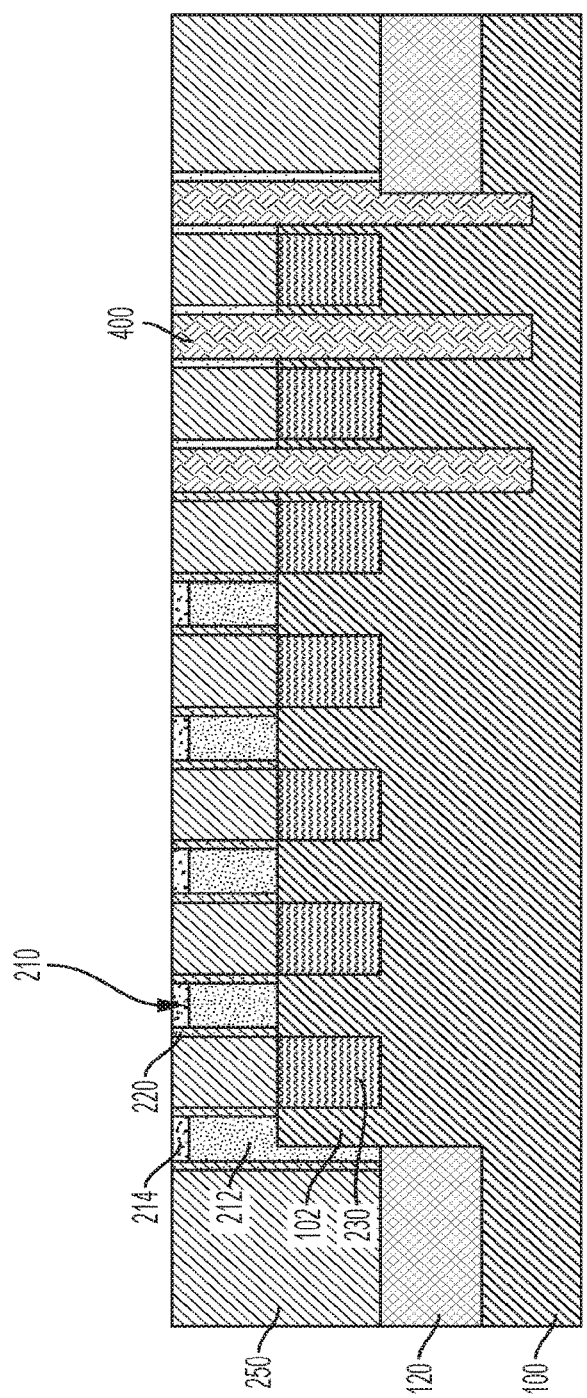
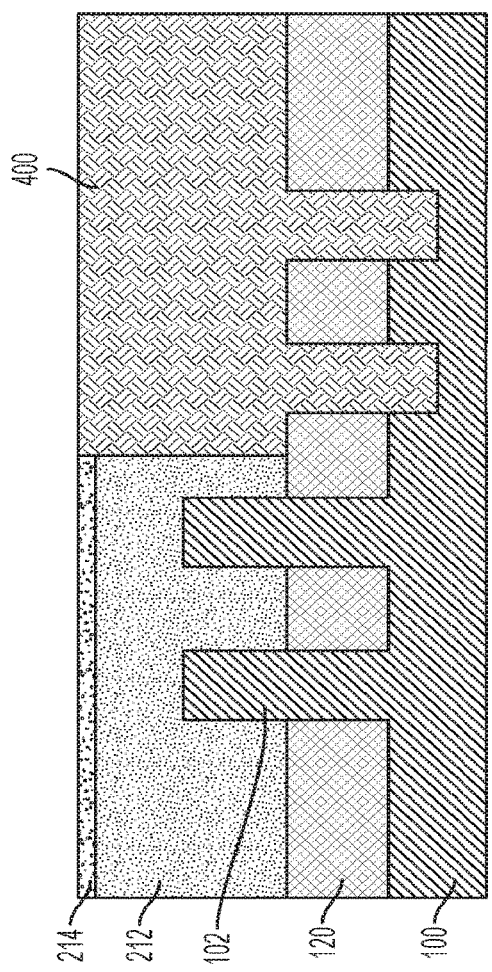

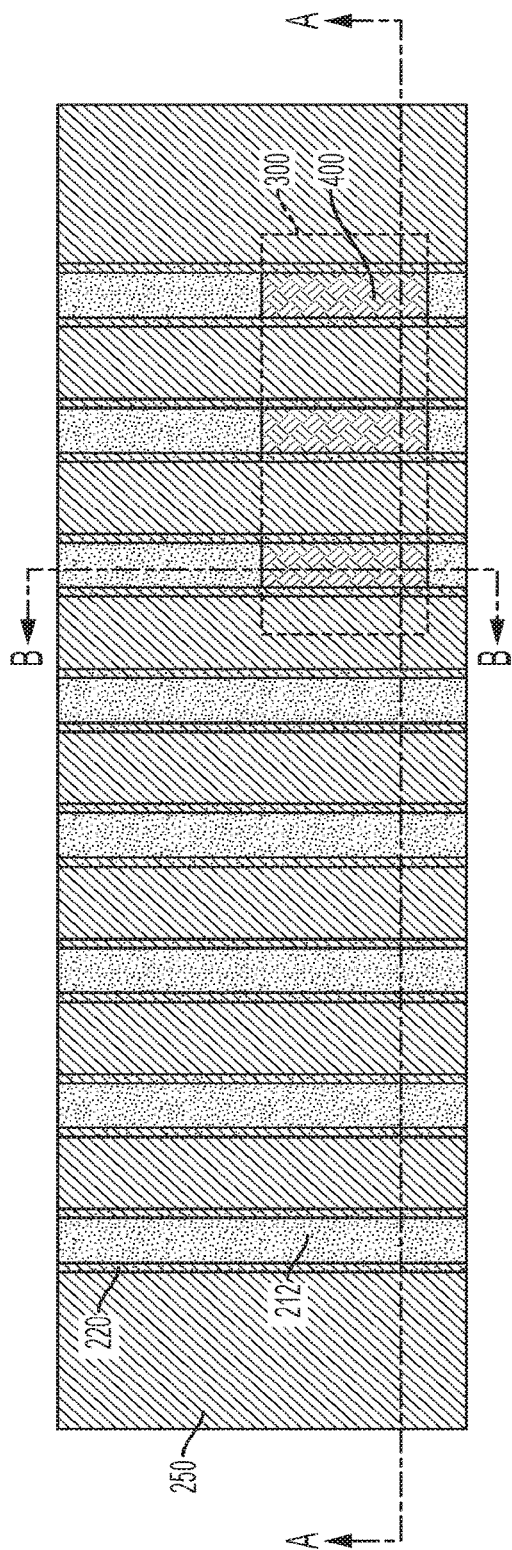
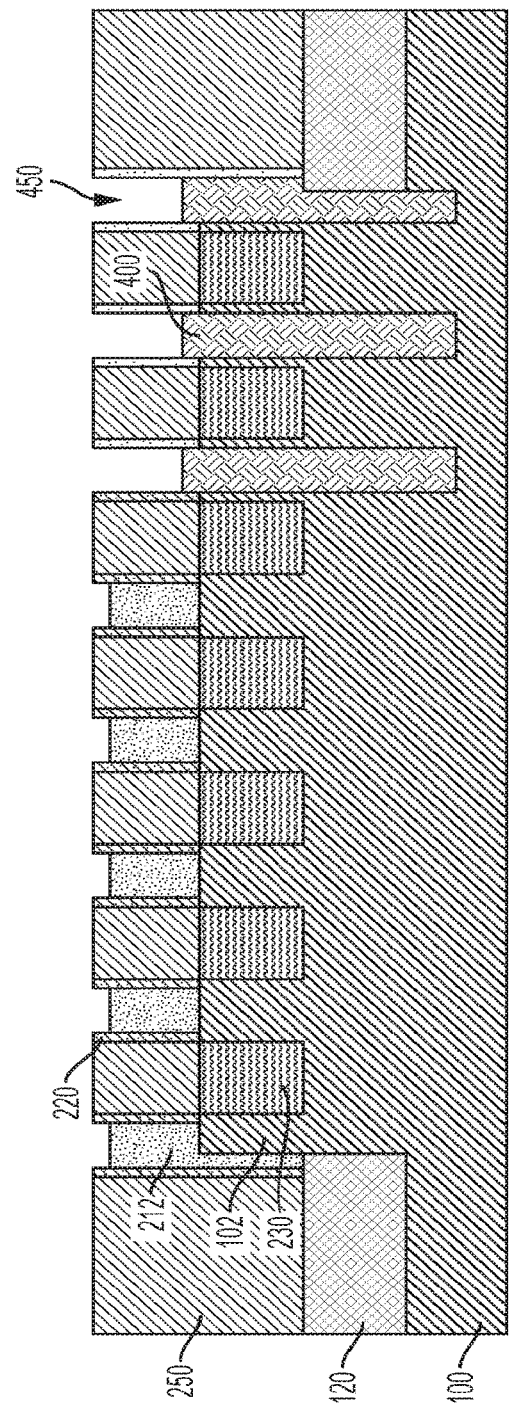
FIG. 9
FIG. 9A

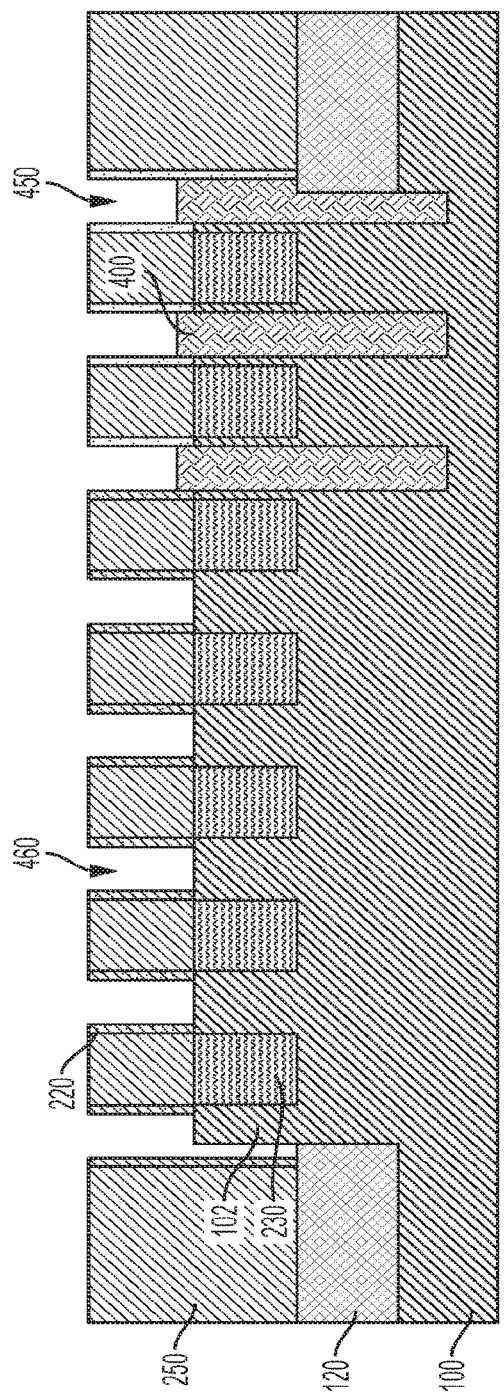
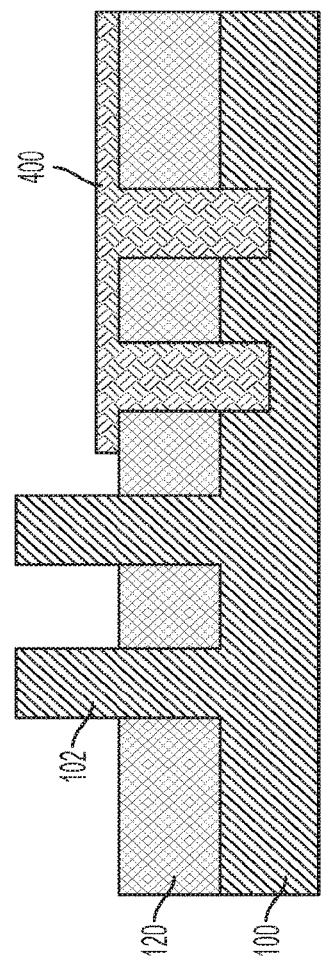

US 11,469,146 B2

METHODS OF PERFORMING FIN CUT ETCH PROCESSES FOR FINFET SEMICONDUCTOR DEVICES

BACKGROUND

The present disclosure generally relates generally to the fabrication of integrated circuits, and more particularly to methods of performing fin cut etch processes for the manufacture of FinFET semiconductor devices.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture over a channel region.

The fins are typically formed in a regular array. As shown in FIG. 1, plural fins 12 may be arranged in parallel, for example, and configured to provide the desired circuit(s) within distinct device regions. To define separate devices, such as a 4-fin device 20 and a 2-fin device 24 on the same substrate, for example, the length of the fins 12 may be adjusted and the fins partitioned by selectively removing some fins or portions of fins. In conventional processing, a fin cut mask (not shown) may be used to define a fin cut region 30, such that the fin cut mask covers fin portions that are to be retained and exposes other fin portions that are to be removed. After defining the fin cut mask, an etch process forms a fin cut opening 32 that removes the exposed fin portions from within the fin cut region 30.

As seen schematically in FIG. 1, however, patterning limitations associated with photolithography, in conjunction with strict alignment tolerances that accompany forming devices at advanced nodes, may result in imprecise alignment of the fin cut mask and/or poor fidelity between the fin cut region 30 and the fit cut opening 32. For example, corner rounding during fin cut patterning may damage or remove fin portions that are intended to be retained. In the hybrid device of FIG. 1, portions of the fins 12 within the 4-fin device region 20 may be undesirably removed.

SUMMARY

Notwithstanding recent developments, processes that cut semiconductor fins with a high-degree of accuracy and precision are desired, particularly for device manufacturing at advanced nodes. In a self-aligned fin cut process for fabricating integrated circuits, as disclosed herein, a sacrificial gate or an epitaxially-formed source/drain region is used in lieu of a lithographically-defined fin cut mask as an etch mask in conjunction with a fin cut etch to remove unwanted portions of the fins.

In accordance with embodiments of the present application, a device includes a plurality of fins disposed over a semiconductor substrate, where the fins include source/drain regions and channel regions extending between the source/drain regions. The device further includes source/drain junctions disposed over the source/drain regions, an interlayer dielectric disposed over the source/drain junctions, and a functional gate stack disposed over the channel regions, wherein at least one of the plurality of fins has a cut region with a dielectric fill layer disposed within the cut region.

In the exemplary device, the dielectric fill layer extends through an entire thickness of the at least one fin, and a pair of opposing edges of the dielectric fill layer are aligned with edges of (i) one of the functional gate stacks, or (ii) one of the source/drain junctions.

A method of forming a device includes forming a plurality of fins over a semiconductor substrate, forming a plurality of sacrificial gate stacks over the fins, forming a spacer layer over sidewalls of the sacrificial gate stacks, forming source/drain junctions over exposed portions of the fins between adjacent spacer layers, and forming an interlayer dielectric over the source/drain junctions between adjacent spacer layers.

A masking layer is formed over the interlayer dielectric and over the sacrificial gate stacks, and an opening is formed in the masking layer to define a fin cut region. Using the masking layer as an etch mask, the method further includes selectively etching one of (i) the sacrificial gate stacks within the fin cut region, or (ii) the interlayer dielectric and source/drain junctions within the fin cut region to expose the fins within the fin cut region. Fin cut openings are formed by etching the exposed fins, and a dielectric fill layer is formed within the fin cut openings.

A further method of forming a device includes forming a plurality of fins over a semiconductor substrate, forming a plurality of sacrificial gate stacks over the fins, forming a spacer layer over sidewalls of the sacrificial gate stacks, forming epitaxial source/drain junctions over exposed portions of the fins between adjacent spacer layers, and forming an interlayer dielectric over the source/drain junctions between adjacent spacer layers.

A masking layer is formed over the interlayer dielectric and over the sacrificial gate stacks, and an opening is formed in the masking layer to define a fin cut region. Using the masking layer as an etch mask, the method includes etching one of (i) the sacrificial gate stacks within the fin cut region, or (ii) the interlayer dielectric and the epitaxial source/drain junctions within the fin cut region, to expose the fins within the fin cut region. The exposed fins are etched to form fin cut openings, and a dielectric fill layer is formed within the fin cut openings.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a top-down schematic plan view diagram showing a plurality of fins arrayed over a semiconductor substrate;

FIG. 2A is a cross-sectional view along one of the fins of FIG. 2;

FIG. 6A depicts selective etching of the sacrificial gates within the fin cut region;

FIG. 6B depicts etching of the sacrificial gates within the fin cut region to expose a plurality of the fins;

FIG. 8A shows deposition of a dielectric fill layer within the fin cut openings;

FIG. 8B shows deposition of a dielectric fill layer within the fin cut openings and polishing of the dielectric fill layer;

FIG. 9 is a top-down schematic plan view showing the dielectric fill layer aligned with the sacrificial gates within the fit cut region after removal of the masking layer;

FIG. 9A is a cross-sectional view showing the dielectric fill layer aligned with the sacrificial gates within the fin cut region after removal of the masking layer and a recess etch of the dielectric fill layer;

FIG. 10A shows removal of the remaining sacrificial gates located outside of the fin cut region;

FIG. 10B shows removal of the sacrificial gate from outside of the fin cut region;

DETAILED DESCRIPTION

Figure 1:
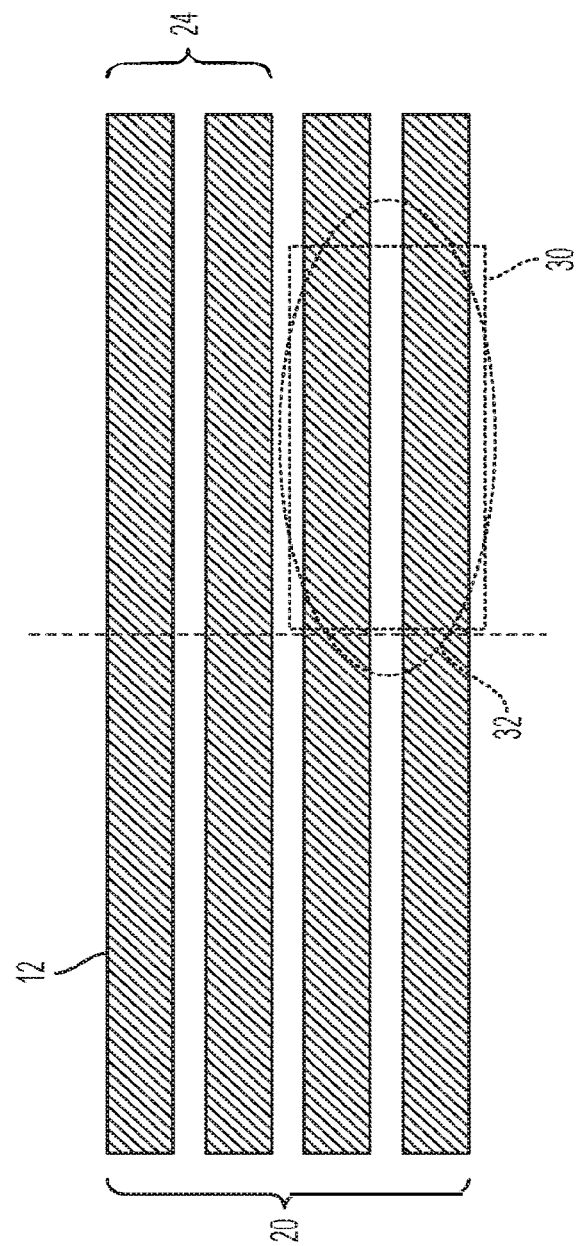
FIG. 1 is a schematic diagram of a FinFET device layout showing a fin cut region and the location of a fin cut opening within a second device region of a semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

The various components and layers of the structures disclosed herein may be formed using a variety of different materials and methods, e.g., a chemical vapor deposition (CVD) process, an atomic layer deposition (ALD) process, a thermal growth process, spin-coating techniques, etc. The compositions and thicknesses of these various layers of material may vary, depending upon the particular application.

Various embodiments related to the formation of hybrid, e.g., tapered, FinFET structures are described herein with reference to FIGS. 2-19. A first embodiment is illustrated in connection with FIGS. 2-12, and a second embodiment is illustrated with reference to FIGS. 13-19. Tapered FinFET structures include a first number of fins within a first device region and a second number of fins within a second, adjacent device region, where the first and second numbers of fins are different and at least one of the fins within the first device region extends into the second device region.

Referring to FIG. 2, a simplified top down plan view schematic diagram of a FinFET architecture at an intermediate stage of fabrication includes a plurality of fins 102 disposed over a semiconductor substrate (not shown). A shallow trench isolation layer 120 is formed over the substrate and between adjacent fins 102. Reference line A is oriented parallel to and along the length dimension of a fin, while reference line B is oriented perpendicular to a length dimension of the fins 102, i.e., across later-formed gates.

Figure 2B:
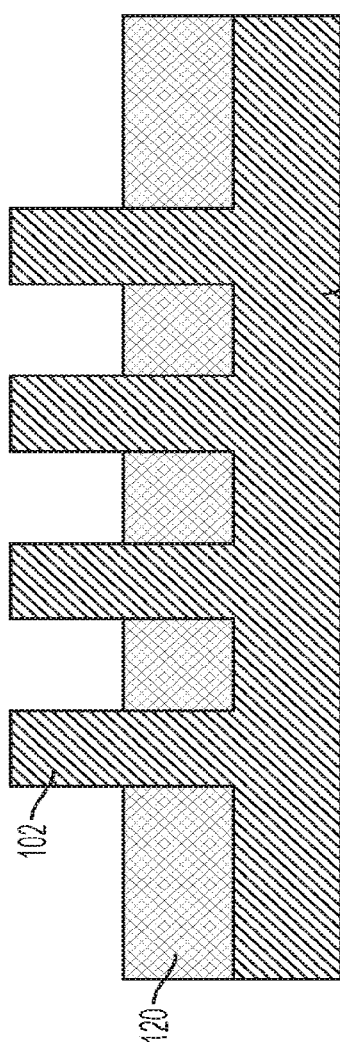
FIG. 2B is a cross-sectional view transverse to the length of the fins.

Mutually transverse cross-sectional views of the FinFET device structure of FIG. 2 are shown in FIG. 2A and FIG. 2B. FIG. 2A is taken along line A of FIG. 2, and FIG. 2B is taken along line B. The exemplary structure includes a semiconductor substrate 100 and a plurality of semiconductor fins 102 arrayed over the substrate 100.

In the illustrated embodiment, the semiconductor fins 102 are arranged in parallel and are laterally isolated from each other within a sub-fin region 122 by shallow trench isolation layer 120. The fins 102 extend above a top surface of the shallow trench isolation layer (STI) layer 120 and define an active device region 124.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may be, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

In various embodiments, fins 102 include a semiconductor material such as silicon, and may be formed by patterning and then etching the semiconductor substrate 100, e.g., a top portion of the semiconductor substrate. In several embodiments, the fins 102 are etched from, and therefore contiguous with the semiconductor substrate 100. For instance, fins 102 may be formed using a sidewall image transfer (SIT) process as known to those skilled in the art.

In certain embodiments, the fins 102 can have a width of 5 nm to 20 nm and a height of 40 nm to 150 nm, although other dimensions are also contemplated. Fins 102 may be arrayed on the substrate at a regular intrafin spacing or pitch (d). As used herein, the term "pitch" refers to the sum of the fin width and the spacing between a pair of adjacent fins. In example embodiments, the fin pitch (d) within a given device region may be within a range of 20 to 100 nm, e.g., 20, 30, 40, 50, 60, 70, 80, 90 or 100 nm, including ranges between any of the foregoing values, although smaller and larger pitch values may be used.

Shallow trench isolation (STI) layer 120 may be used to provide electrical isolation between the fins 102 and between adjacent devices as is needed for the circuit(s) being formed. An example STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 120 between the fins 102, where upper sidewalls of the fins 102, i.e., sidewalls within active device region 124, can be exposed for further processing.

Figure 3:
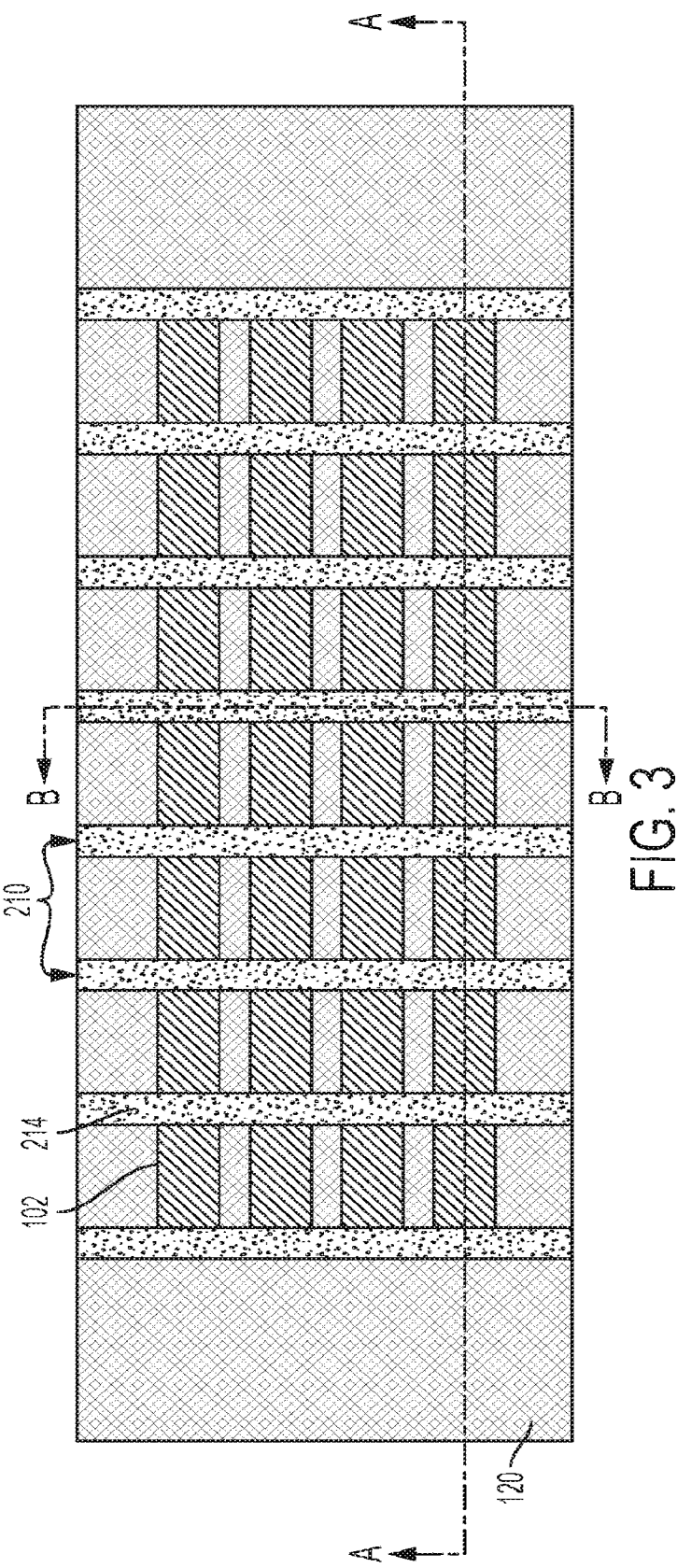
FIG. 3 is a top-down schematic plan view diagram showing the formation of sacrificial gates over the plurality of fins.
Figure 3A:
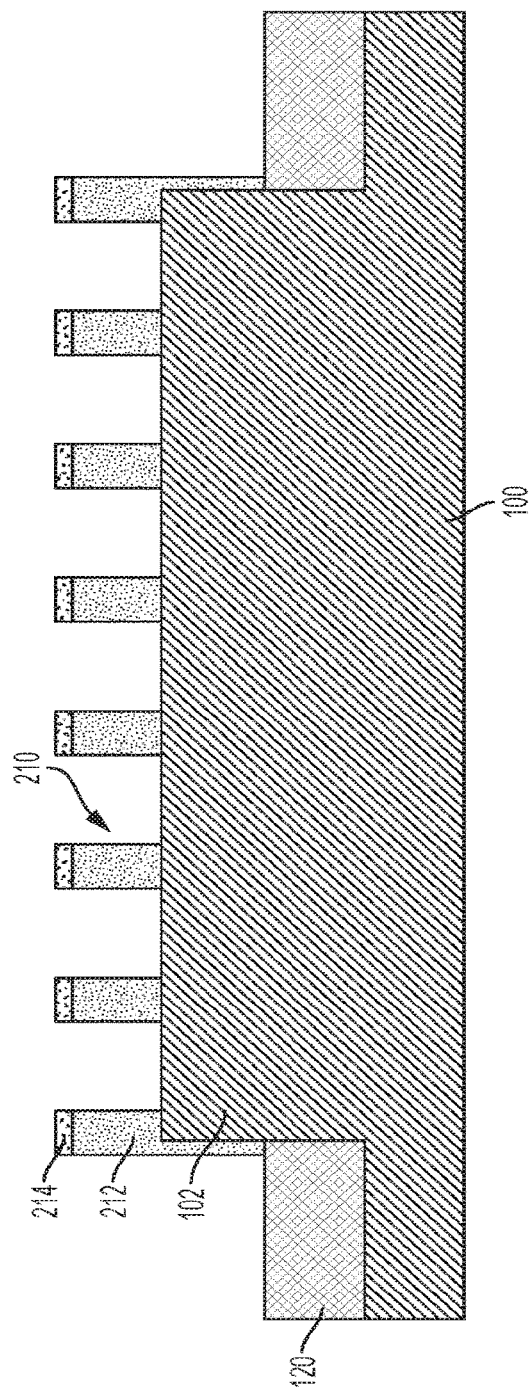
FIG. 3A is a cross-sectional view along one of the fins of FIG. 3 showing the overlying sacrificial gates.
Figure 3B:
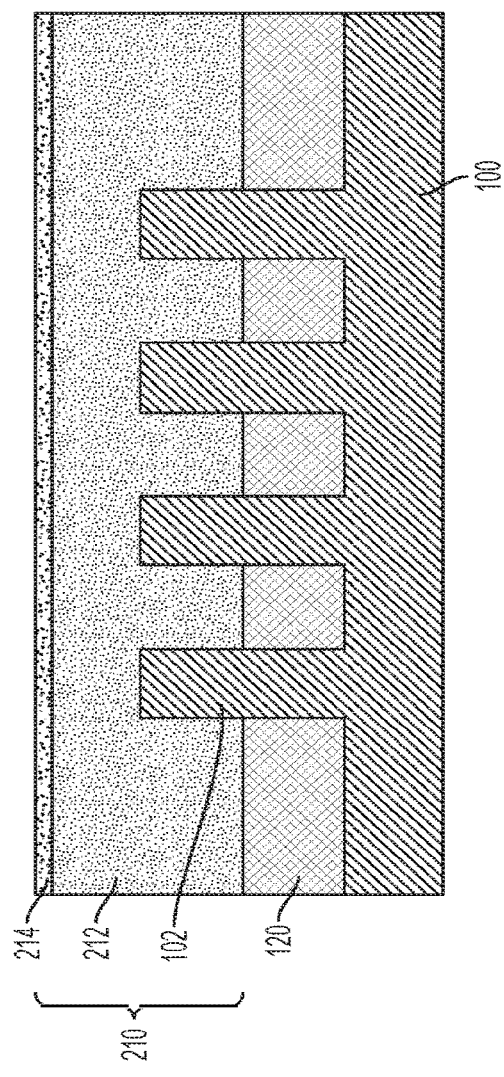
FIG. 3B is a cross-sectional view through the plurality of fins showing an overlapping sacrificial gate.

Referring to FIG. 3, FIG. 3A and FIG. 3B, a set of sacrificial gate stacks 210 are arranged orthogonal to and straddle the fins 102. The sacrificial gate stacks 210 are formed directly over the fins 102 and directly over the STI layer 120, i.e., over substrate 100. The sacrificial gate stacks 210 may include a sacrificial gate layer 212 and an overlying sacrificial gate cap 214, which are deposited in succession and patterned using conventional lithography, for example.

In certain embodiments, the sacrificial gate layer 212 may include a sacrificial oxide layer and an overlayer of amorphous silicon (a-Si), and the sacrificial gate cap 214 may include silicon nitride. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The sacrificial gate layer 212 may have a thickness sufficient to completely cover the fins. For instance, a thickness of sacrificial gate layer 212 may range from 50 to 200 nm, e.g., 50, 75, 100, 125, 150, 175 or 200 nm, including ranges between any of the foregoing values, although lesser and greater thicknesses may be used.

Figure 4:
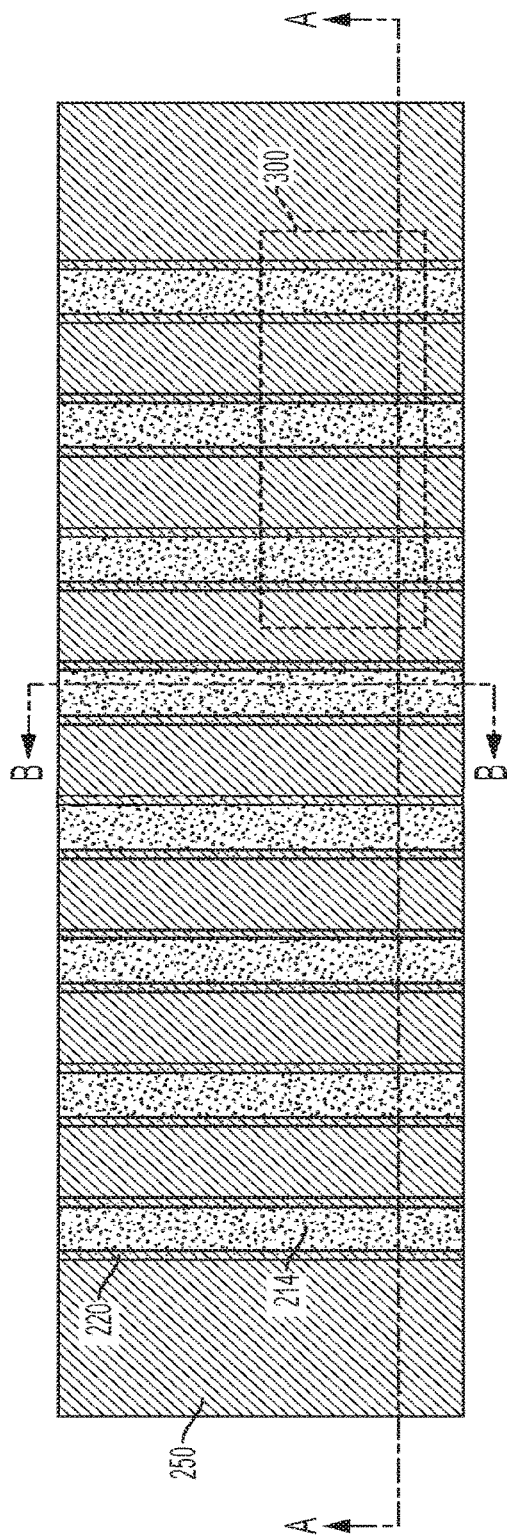
FIG. 4 is a top-down schematic plan view diagram showing a post-planarization architecture including sidewall spacers and an interlayer dielectric formed over the fins, and the location of a fin cut region within a second device region of the substrate.
Figure 4A:
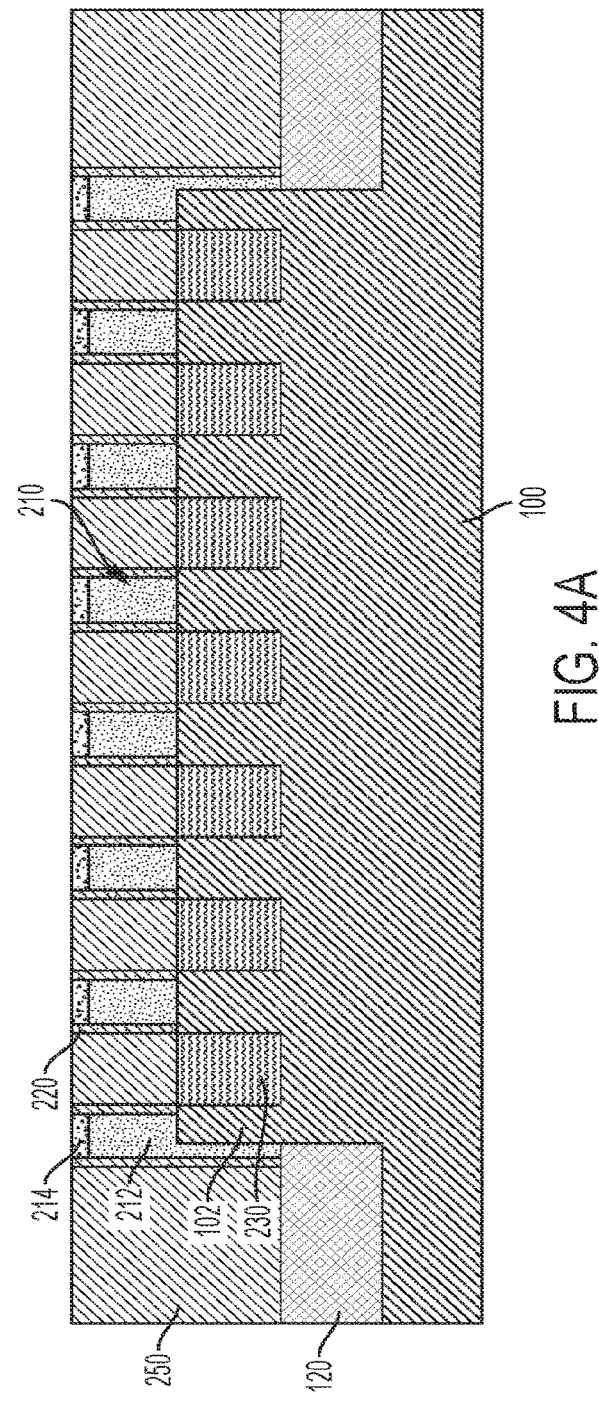
FIG. 4A is a cross-sectional view showing the formation of the sidewall spacers over the sacrificial gates and the subsequent formation of epitaxial source/drain regions over portions of a fin.
Figure 4B:
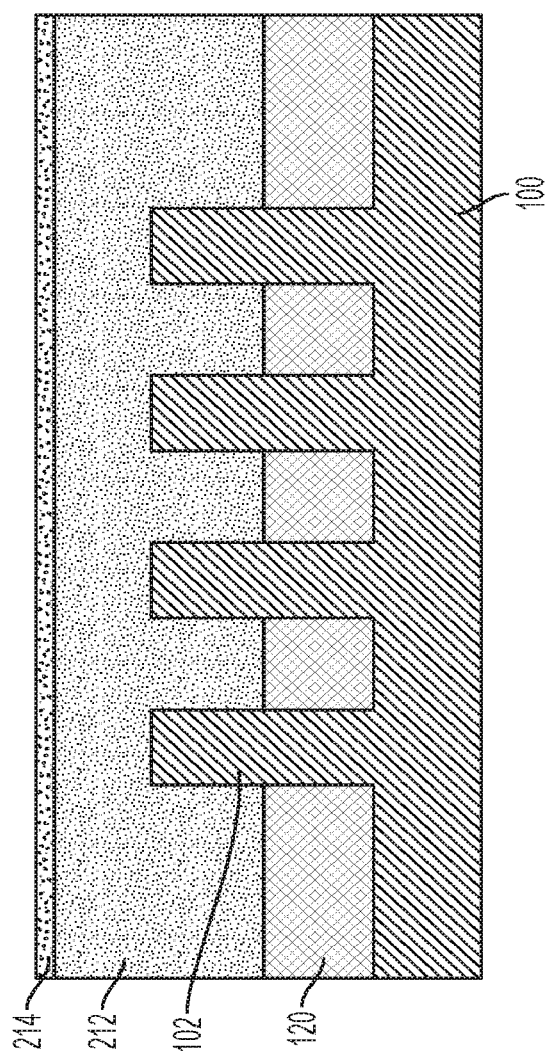
FIG. 4B is a cross-sectional view through the plurality of fins showing an overlying sacrificial gate.

Referring to FIG. 4, and in particular FIG. 4A and FIG. 4B, sidewall spacers 220 may be formed over sidewalls of the sacrificial gate stack 210 by blanket deposition of a spacer material (e.g., using atomic layer deposition) followed by a directional etch such as reactive ion etching (RIE) to remove the spacer material from horizontal surfaces. Suitable sidewall materials for sidewall spacer 220 include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. In certain embodiments, the sidewall spacer 220 thickness is 4 to 20 nm, e.g., 4, 10, 15 or 20 nm, including ranges between any of the foregoing values.

As will be appreciated, the compounds silicon dioxide and silicon nitride have compositions that are nominally represented as $SiO_2$ and $Si_3N_4$, respectively. As used herein, the terms silicon dioxide and silicon nitride refer to not only these stoichiometric compositions, but also to oxide and nitride compositions that deviate from the stoichiometric compositions.

Also, as used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

FIG. 4A shows the structure of FIG. 3A after the deposition of sidewall spacers 220 over the sacrificial gate stacks 210 and the formation of epitaxial source/drain junctions 230 over source/drain regions of the fin 102.

In the illustrated embodiment, source/drain junctions 230 are disposed over portions of the fins 102 (i.e., source and drain regions) proximate to top surfaces thereof. As known to those skilled in the art, source/drain junctions 230 may be formed by ion implantation or selective epitaxy, optionally using the sacrificial gate stacks 210 and sidewall spacers 220 as an alignment mask. For instance, according to various embodiments, source/drain junctions 230 are formed by selective epitaxy into self-aligned locations that are defined over the fins between the sacrificial gate stacks 210 and over-formed sidewall spacers 220. That is, source/drain junctions 230 are formed over source and drain regions of the fins 102 on either side of a channel region, which underlies the sacrificial gate stack 210.

Source/drain junctions 230 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

Referring still to FIGS. 4 and 4A, an interlayer dielectric (ILD) 250 is deposited over the source/drain junctions 230, i.e., between sacrificial gate stacks 210. The deposited ILD layer 250, which may include silicon dioxide or a bi-layer of silicon nitride and an overlying layer of silicon dioxide, may be polished to remove the overburden and create a planarized structure.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Referring again to FIG. 4, a fin cut region 300 identifies, according to several embodiments, the portions of the fins 102 that are to be cut. According to the present embodiment, along the length dimension of the fins, opposing ends of the fin cut region 300 overlie ILD 250.

Figure 5A:
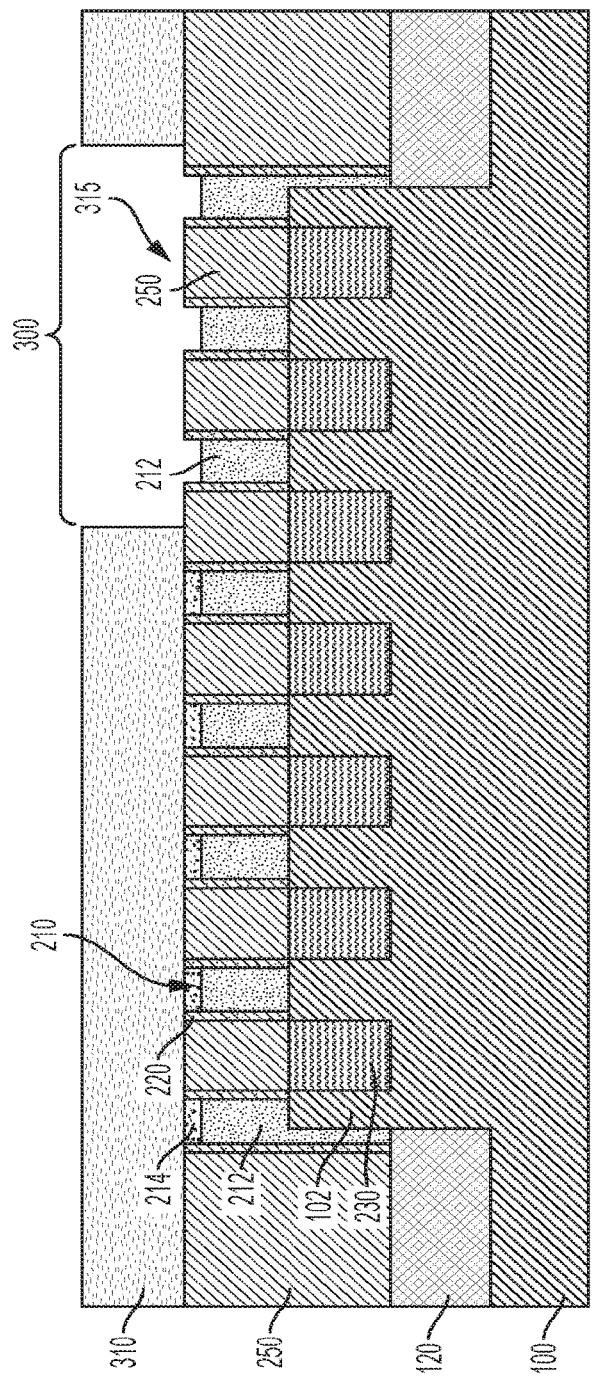
FIG. 5A depicts the formation and patterning of a masking layer defining a fin cut region over a portion of a fin and the removal of the sacrificial gate caps from within the fin cut region.
Figure 5B:
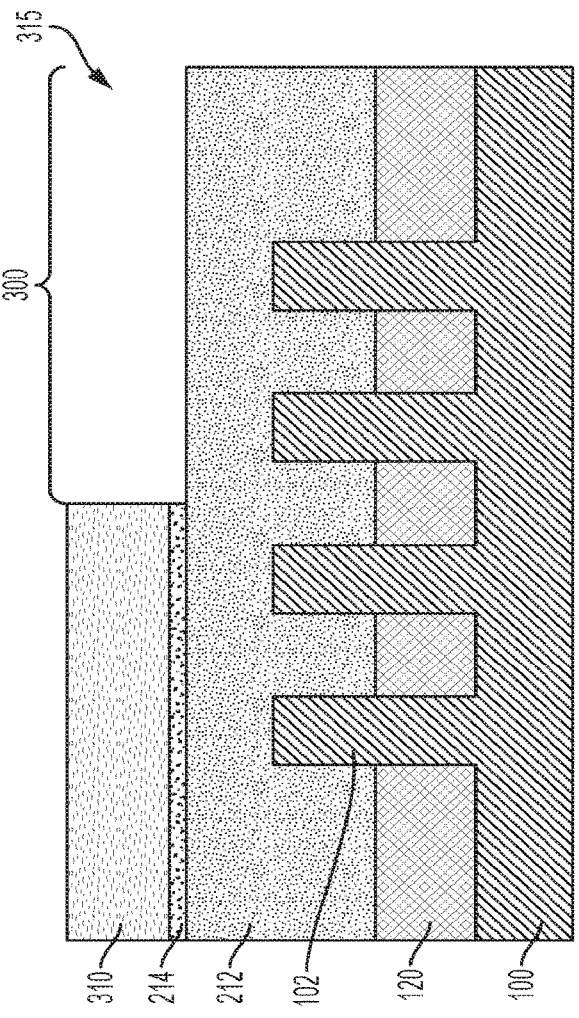
FIG. 5B shows the location of the masking layer in a cross-sectional view transverse to the view of FIG. 5A.

Referring to FIG. 5A and FIG. 5B, a masking layer 310 (e.g., an organic planarization layer or OPL) is patterned and etched to form an opening 315 aligned with the fin cut region 300. At the intermediate stage of fabrication shown in the illustrated embodiment, the sacrificial gate cap 214 is removed, and top surfaces of the sacrificial gate layer 212 and the ILD 250 are exposed at the bottom of the opening 315.

Patterning and etching of masking layer 310 to form the opening 315 may include forming a lithography stack over the masking layer (not shown). For instance, a lithography stack may include one or more of a photoresist layer, an etch stop layer, an amorphous carbon layer, an adhesion layer, an oxide layer, and a nitride layer. Such layers may be configured as known to those skilled in the art to provide a suitable masking layer to pattern and etch the underlying layer(s). According to various embodiments, the areal dimensions of the openings 315 are within lithography process windows for forming such structures.

The pattern transfer etching process to form opening 315 is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Referring to FIG. 6A and FIG. 6B, after exposing sidewall spacers 220 and ILD 250 within the fin cut region 300, a selective etch is used to remove the sacrificial gate layer 212 and expose the underlying fin 102. That is, the selective etch removes the sacrificial gate layer 212 selectively with respect to sidewall spacers 220 and ILD 250.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Figure 7A:
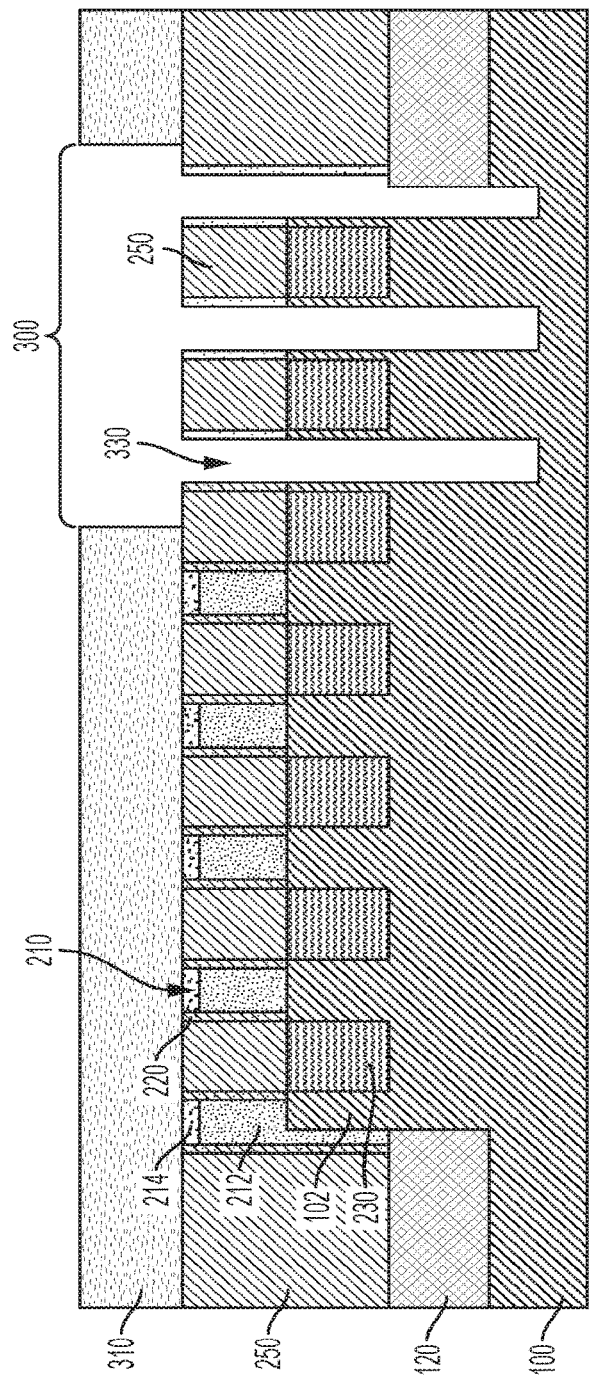
FIG. 7A shows anisotropic etching of portions of the fins within the fin cut region using the sidewall spacers and the interlayer dielectric as an etch mask to form fin cut openings.
Figure 7B:
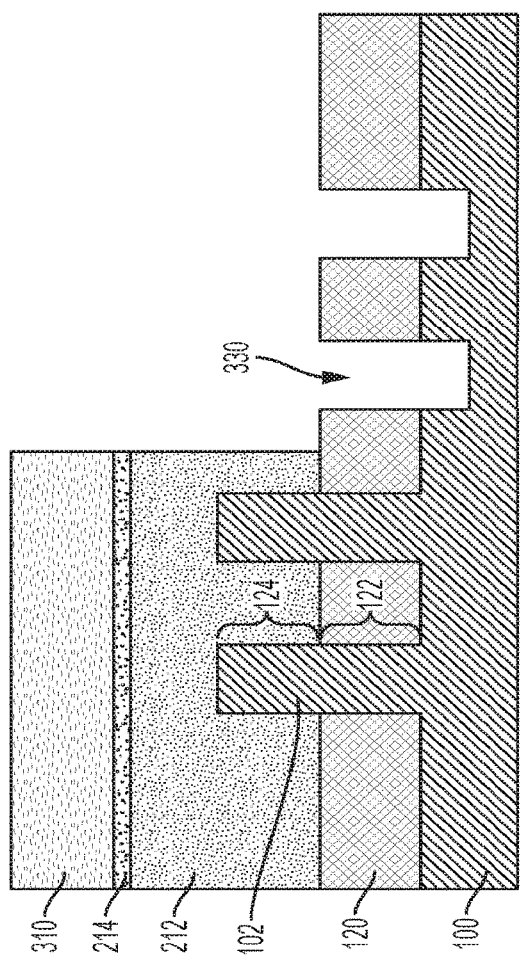
FIG. 7B shows etching of the fins within the fin cut region.

Within the fin cut region 300, exposed portions of the fins 102 are then etched using a selective fin etch to form fin cut openings 330. The fin etch may be an isotropic or an anisotropic etch. Silicon, for example, can be etched selectively with respect to the sidewall spacers 220 and ILD 250. In certain embodiments, as shown in FIG. 7A and FIG. 7B, the fin cut etch extends into the substrate 100, such that portions of both the active device region 124 and the sub-fin region 122 of the fins within the fin cut region 300 are removed.

Referring to FIG. 8A and FIG. 8B, fin cut openings 330 created by removing portions of the fins 102 are then back-filled with a dielectric fill layer 400. Dielectric fill layer 400 may include silicon nitride, for example. The structure can then be planarized, e.g., using the sacrificial gate cap 214 as an etch stop layer. The inlaid dielectric fill layer 400 within the fin cut region 300 is shown in FIG. 9.

Figure 9B:
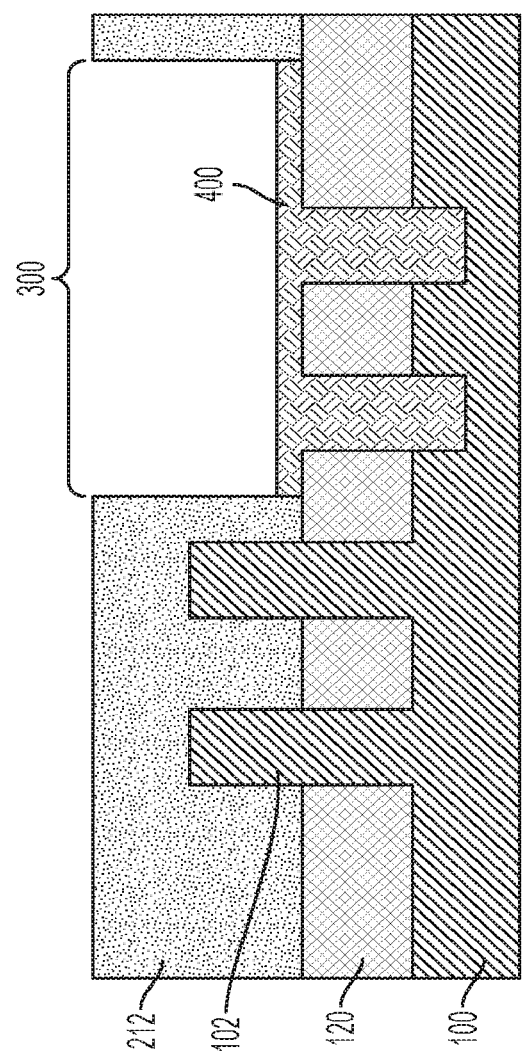
FIG. 9B is a cross-sectional view showing a recessed dielectric fill layer within the fin cut region.

Referring to FIG. 9A and FIG. 9B, a recess etch of the dielectric fill layer 400 within the fin cut region 300 defines openings 450. In the illustrated embodiment, a bottom surface of each opening 450, i.e., a top surface of the recessed dielectric fill layer 400, is above a top surface of the fin 102.

The recess etch of the dielectric fill layer 400 within the fin cut region 300 may precede or accompany a selective etch of the sacrificial gate layer 212 outside of the fin cut region to form openings 460. The device structure following the recess etch of the dielectric fill layer 400 and removal of the sacrificial gate layer 212 is shown in FIG. 10A and FIG. 10B.

Figure 11A:
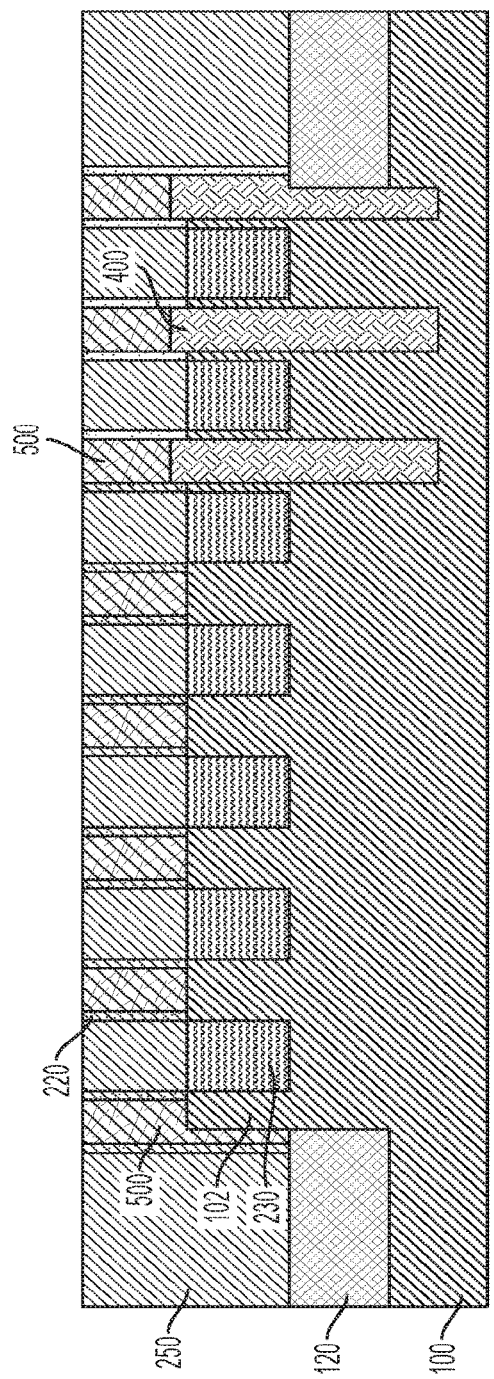
FIG. 11A depicts the formation of functional gates over the fins within a first device region and over the recessed dielectric fill layer within the second device region.
Figure 11B:
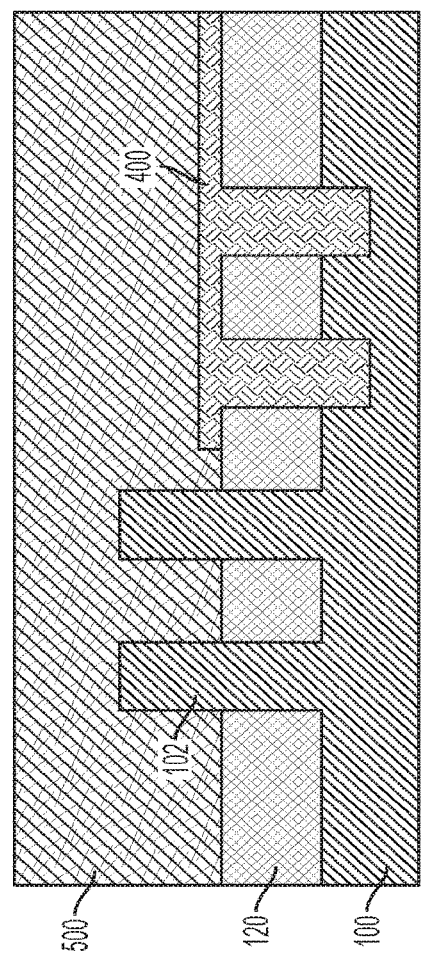
FIG. 11B depicts the formation of a functional gate over the fins within the first device region and over the recessed dielectric fill layer within the second device region.

Referring to FIG. 11A and FIG. 11B, a functional gate architecture 500 is formed over the fins 120, i.e., over the active device region 124 within openings 460 and also within openings 450. The functional gate architecture 500 includes a gate dielectric layer and one or more gate conductor layers, which are deposited in succession. For simplicity, the individual layers of the gate architecture 500 are not separately shown.

As used herein, a "functional gate" refers to a structure used to control output current (i.e., the flow of carriers through a channel) of a semiconductor device using an electrical field or, in some instances, a magnetic field, and includes a gate dielectric and a gate conductor. Metallization of the functional gates and the source/drain regions may be used to form operable devices.

Figure 12:
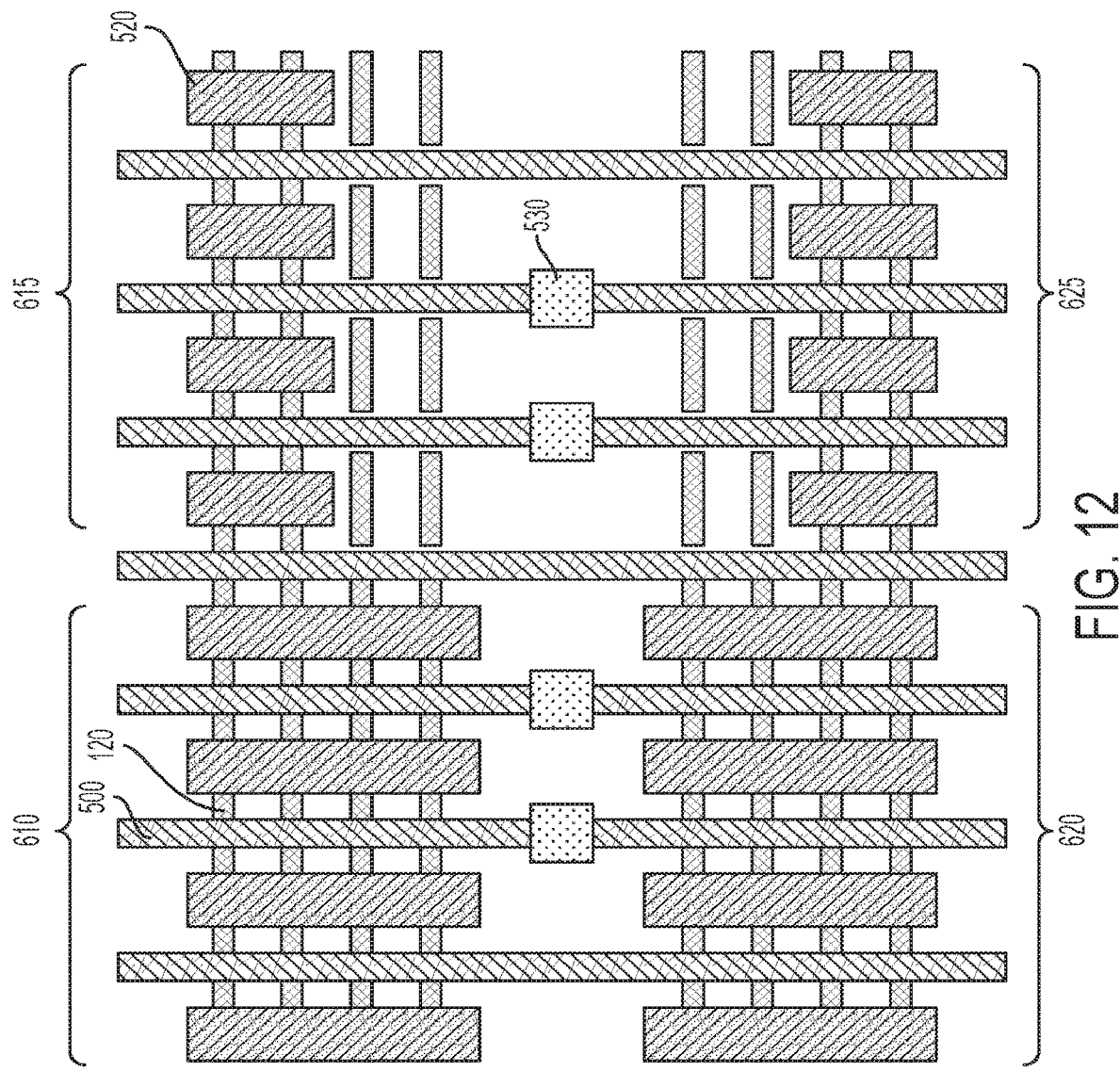
FIG. 12 is a top-down schematic plan view diagram showing a tapered device architecture, including a four fin device located within the first device region and a two fin device located within the second device region.

As will be appreciated, independent transistors may be connected by local interconnection methods and/or back end of the line metallization layers to form integrated circuits, such as SRAM devices. Referring to FIG. 12, a schematic top-down plan view layout of a FinFET device architecture according to the present embodiment includes a plurality of semiconductor fins 102 arrayed over a semiconductor substrate (not shown). As shown, a first plurality of fins 102 define a first device region 610. The first plurality of fins within the first device region 610 may define a first four-fin device, such as a PFET device, for example. A second plurality of fins 102 define a second device region 620. The second plurality of fins within the second device region 620 may define a second four-fin device, such as an NFET device.

Fins 102 extend from first and second device regions 610, 620 laterally into third and fourth device regions 615, 625, respectively. According to the instant embodiment, selected fins 102 within the third and fourth device regions 615, 625 have been cut by exposing portions of the fins within openings that are formed by removing a sacrificial gate and etching the exposed portions of the fins. With such an approach, i.e., removing the sacrificial gate and using the sidewall spacers 220 and ILD 250 as an etch mask for a fin cut module, the cut regions of the fins are aligned with the later-formed functional gate 500. The cut fins enable the formation of a tapered device architecture including, for example, two-fin devices within third and fourth device regions 615, 625.

Referring still to FIG. 12, source/drain contacts 520 overlie source/drain junctions 230 of the fins, and functional gates 500 overlie the fins between adjacent source/drain junctions, i.e., over channel regions of the fins. A gate contact 530 is in electrical contact with gate 500. In the illustrated embodiment, the first four-fin device and the second four-fin device within the first and second device regions 610, 620, respectively, share a common gate 500 and a common gate contact 530, and the first two-fin device and the second two-fin device within the third and fourth device regions 615, 625, respectively, share a common gate 500 and a common gate contact 530, where the gate and gate contact for the four fin devices is different than the gate and gate contact for the two fin devices. Removal of the sacrificial gate stacks 210 as well as the recess etch of the dielectric fill layer 400 allows each replacement gate 500 to traverse multiple fins. That is, within the third and fourth device regions 615, 625, gate 500 overlies uncut fins and is aligned with the fin cut(s).

Further, fins 102 that form the first two-fin device within the third device region 615 are common to a subset of the fins that form the first four-fin device within the first device region 610, and fins that form the second two-fin device within the fourth device region 625 are common to a subset of the fins that form the second four-fin device within the second device region 620.

The instant method of severing selected fins to form two fin devices, e.g., where a lower drive current may be required compared to four fin device, produces a fin cut that is aligned to the later-formed gate, and obviates etch damage to the fins, e.g., within source/drain regions thereof.

Figure 13:
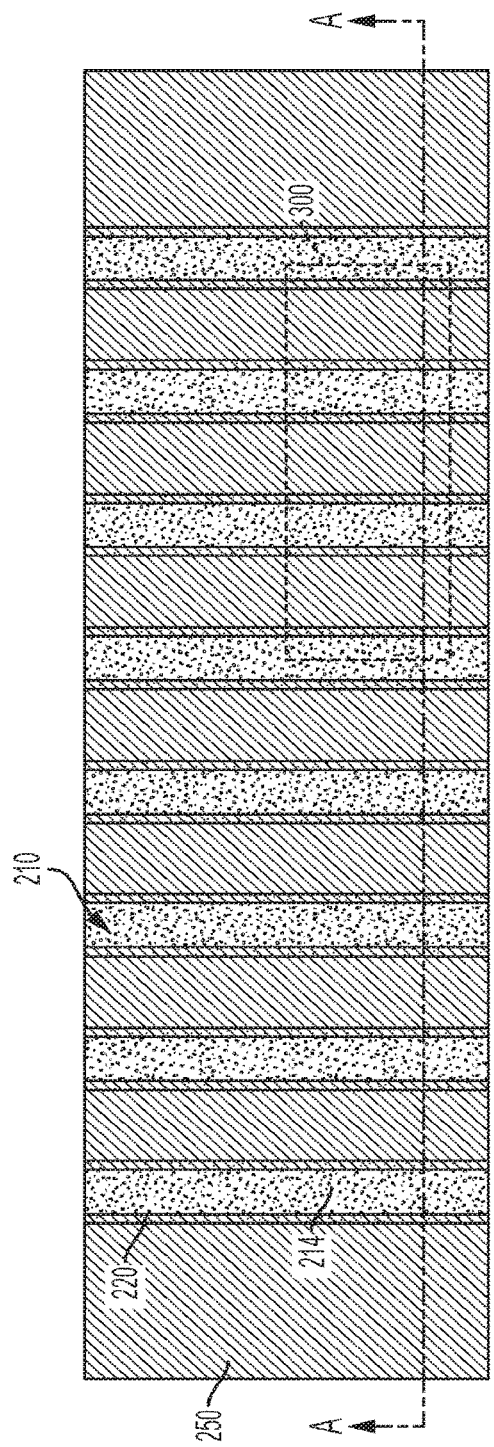
FIG. 13 is a top-down schematic plan view diagram showing a post-planarization device architecture including sidewall spacers and an interlayer dielectric formed over semiconductor fins, and the location of a fin cut region within a second device region according to further embodiments.

According to a further embodiment, the sacrificial gate stack and the sidewall spacers can be used as an etch mask for a fin cut module by first removing the ILD 250 and source/drain junction 230 overlying the fin. Referring to FIG. 13, following the formation of a plurality of fins, sacrificial gate stacks 210 over the fins, sidewall spacers 220 over the sacrificial gate stacks 210, source/drain junctions 230 and a planarized ILD layer 250, a top down plan view schematic diagram of a FinFET architecture includes a fin cut region 300 defined according to a further embodiment. In the illustrated structure, along the length dimension of the fins 120, opposing ends of the fin cut region 300 shown in FIG. 13 overlie sacrificial gate stacks 210.

Thus, as in the previous embodiment, the fin cut region 300 defines the portions of fins that are to be cut. In lieu of removing the sacrificial gate stacks within the gate cut opening and using the sidewall spacers and ILD layer as an etch mask to cut the fins, however, according to the present embodiment, the ILD layer and source/drain junctions are removed within the fin cut region 300, and the sacrificial gate stack 210 and sidewall spacers 220 are used as an etch mask to cut the fins.

Figure 14:
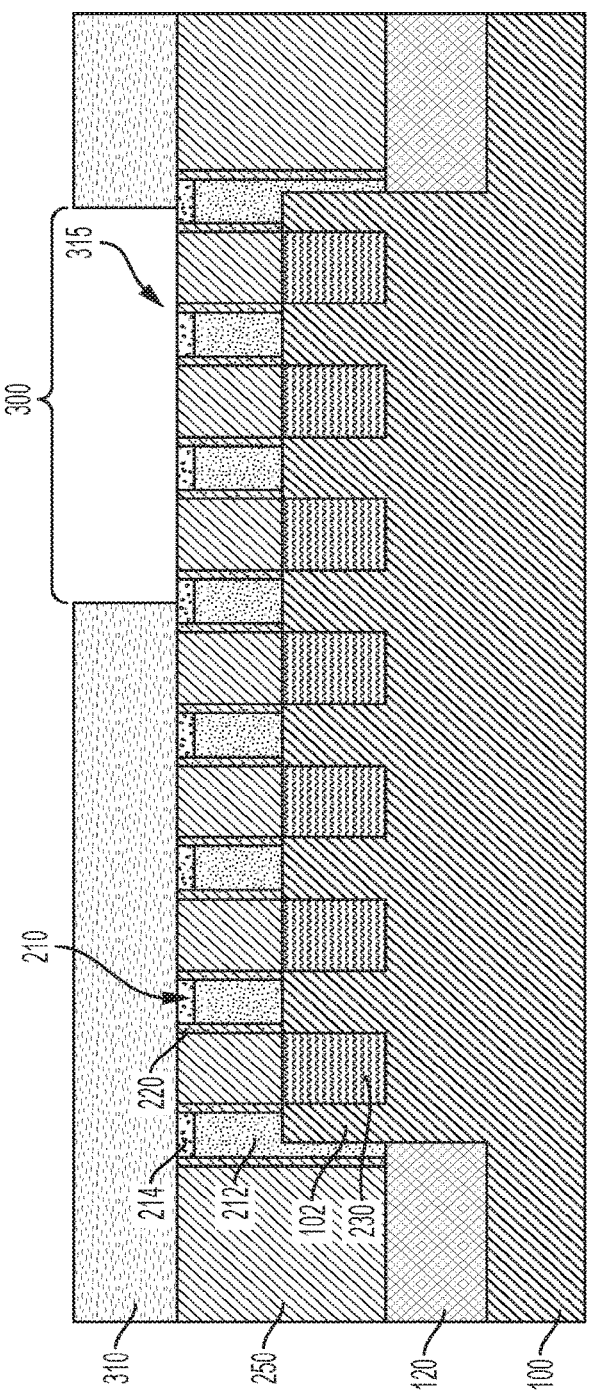
FIG. 14 depicts the formation and patterning of a masking layer defining a fin cut region over a portion of a fin within the second device region.
Figure 15:
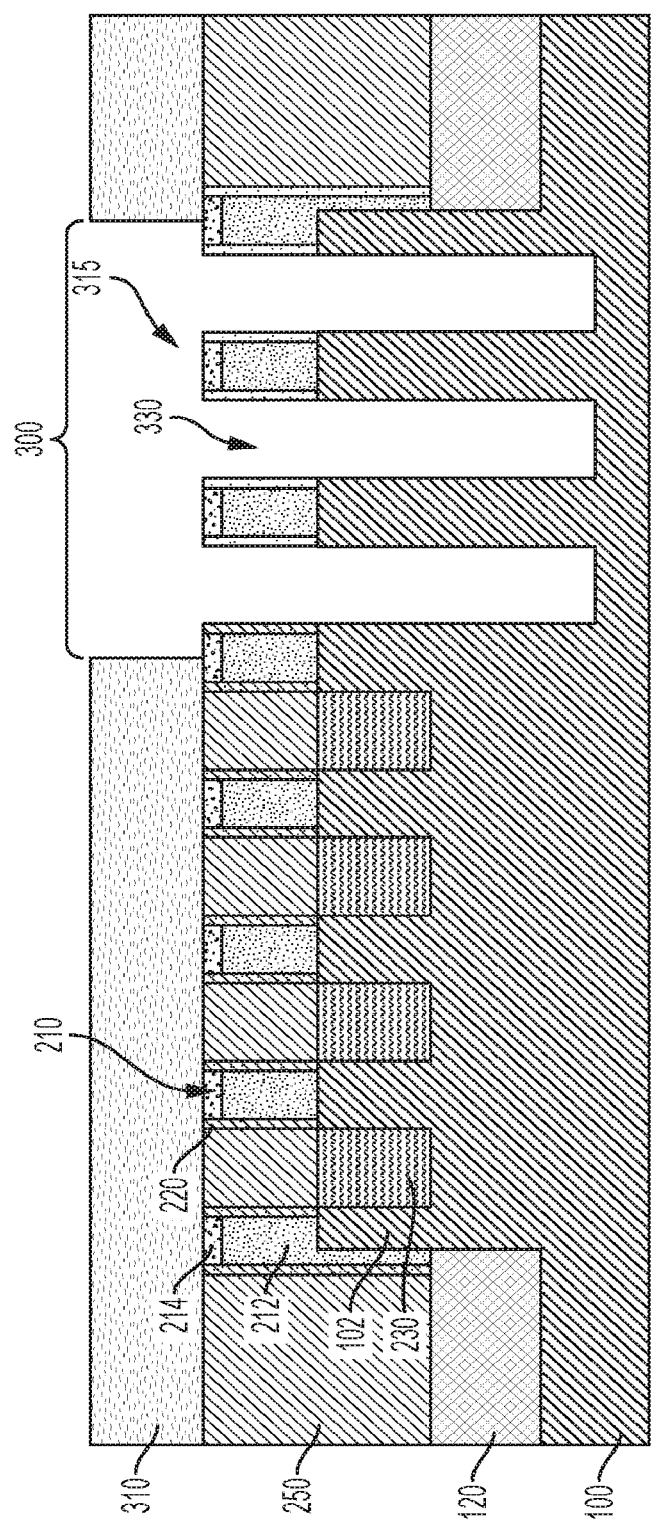
FIG. 15 shows anisotropic etching of portions of the fins within the fin cut region using the sidewall spacers and the sacrificial gates as an etch mask to form fin cut openings.

Referring to FIG. 14, masking layer 310 (e.g., an organic planarization layer or OPL) is patterned and etched to form an opening 315 in the masking layer 310 aligned with the fin cut region 300. The structure following a selective etch within the fin cut region 300 of the ILD layer 250, source/drain junctions 230 and exposed fins 102 is shown in FIG. 15. As in the previous embodiment, the fin cut etch extends into the substrate 100, such that both the active device region 124 and the sub-fin region 122 of the fins within the fin cut region 300 are removed to form fin cut openings 330.

Figure 16:
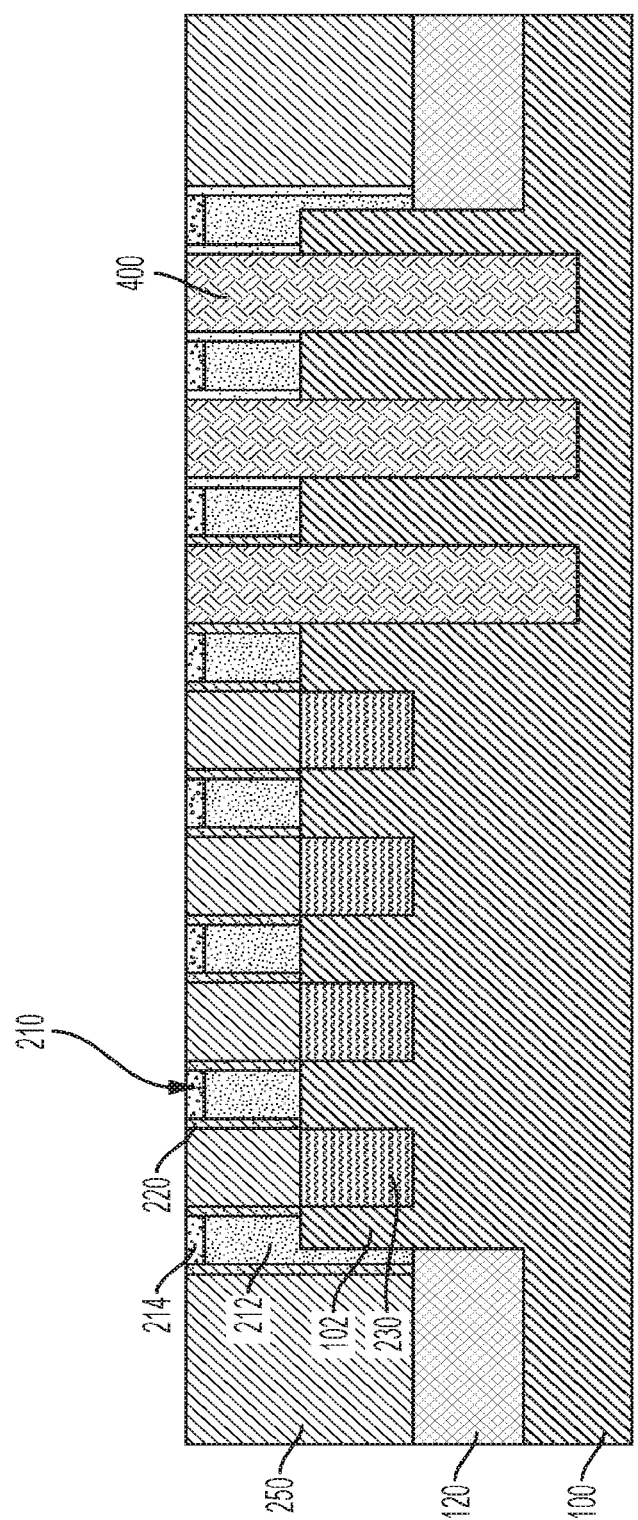
FIG. 16 shows deposition of a dielectric fill layer within the fin cut openings and polishing of the dielectric fill layer.

Referring to FIG. 16, openings 330 created by removing the fins 102 are then back-filled with a dielectric fill layer 400. The structure can be planarized to remove the dielectric fill layer overburden, e.g., using the sacrificial gate cap 214 as an etch stop layer.

Figure 17:
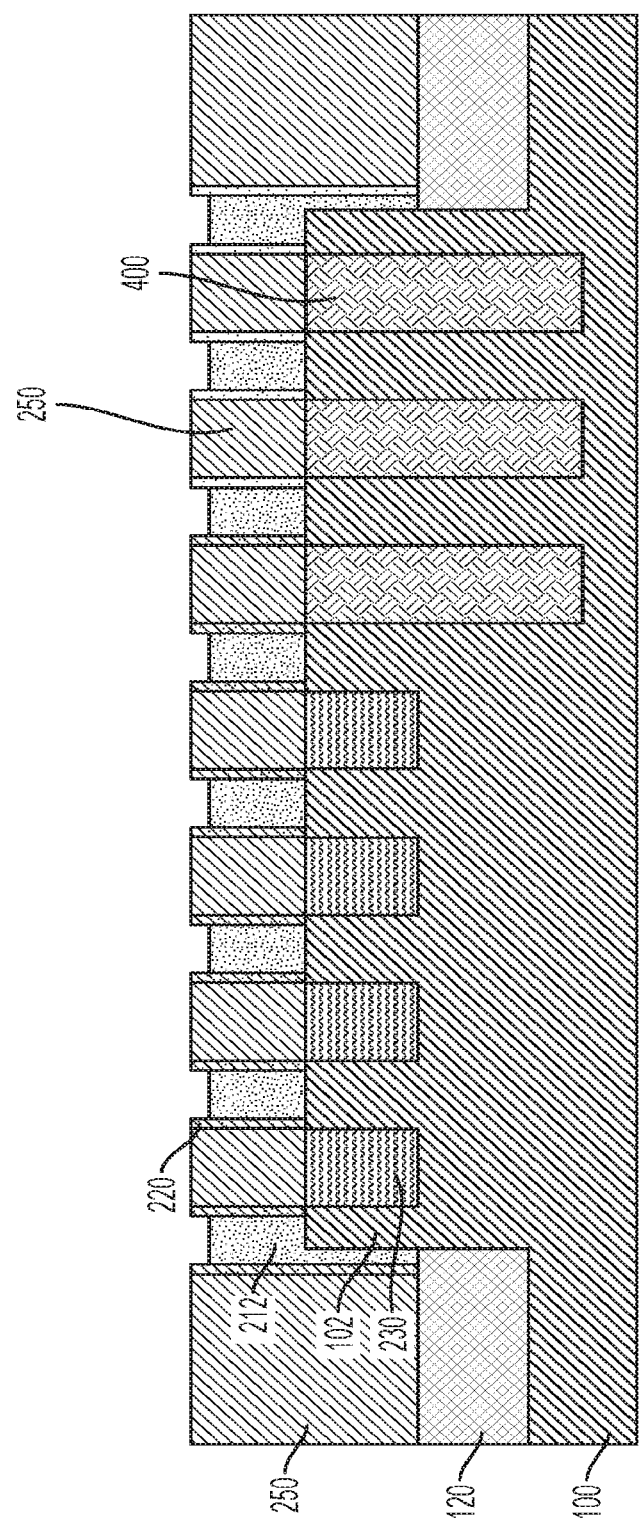
FIG. 17 shows a recess etch of the dielectric fill layer, the deposition of an interlayer dielectric over the recessed dielectric fill layer, and the removal of the sacrificial gate caps to expose the sacrificial gates.
Figure 18:
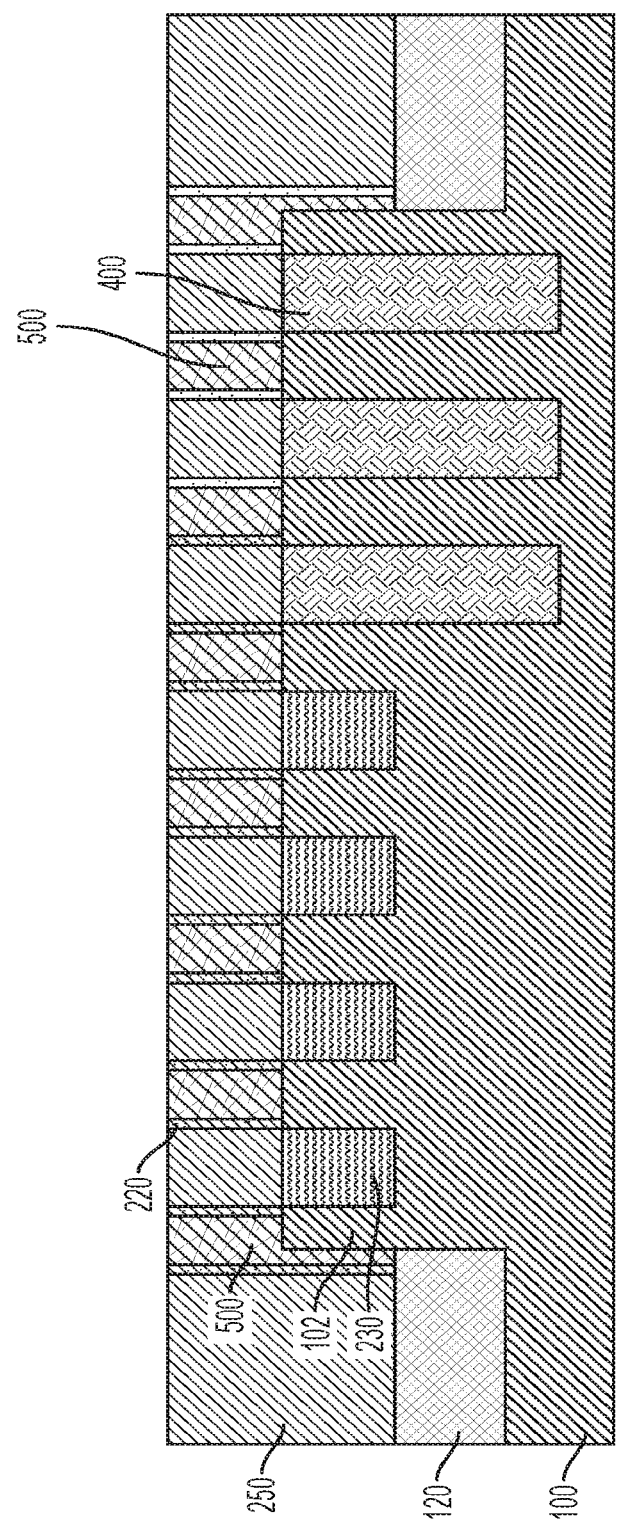
FIG. 18 shows removal of the sacrificial gates and the formation of replacement functional gates over the fins within the first and second device regions.

Referring to FIG. 17, shown is the structure of FIG. 16 following a recess etch of the dielectric fill layer 400, deposition of an interlayer dielectric 250 within the recesses, and removal of the sacrificial gate cap 214 from over the sacrificial gate layer 212. In certain embodiments, the dielectric fill layer 400 includes silicon nitride and the interlayer dielectric 250 includes silicon dioxide. In such case, replacing a nitride layer with an oxide layer may beneficially decrease the capacitance of the circuit. Referring to FIG. 18, the sacrificial gate layer 212 is removed and replaced with a functional gate architecture 500. In the present embodiment, the functional gate architecture 500 is formed over fins inside and outside of the fin cut region.

Figure 19:
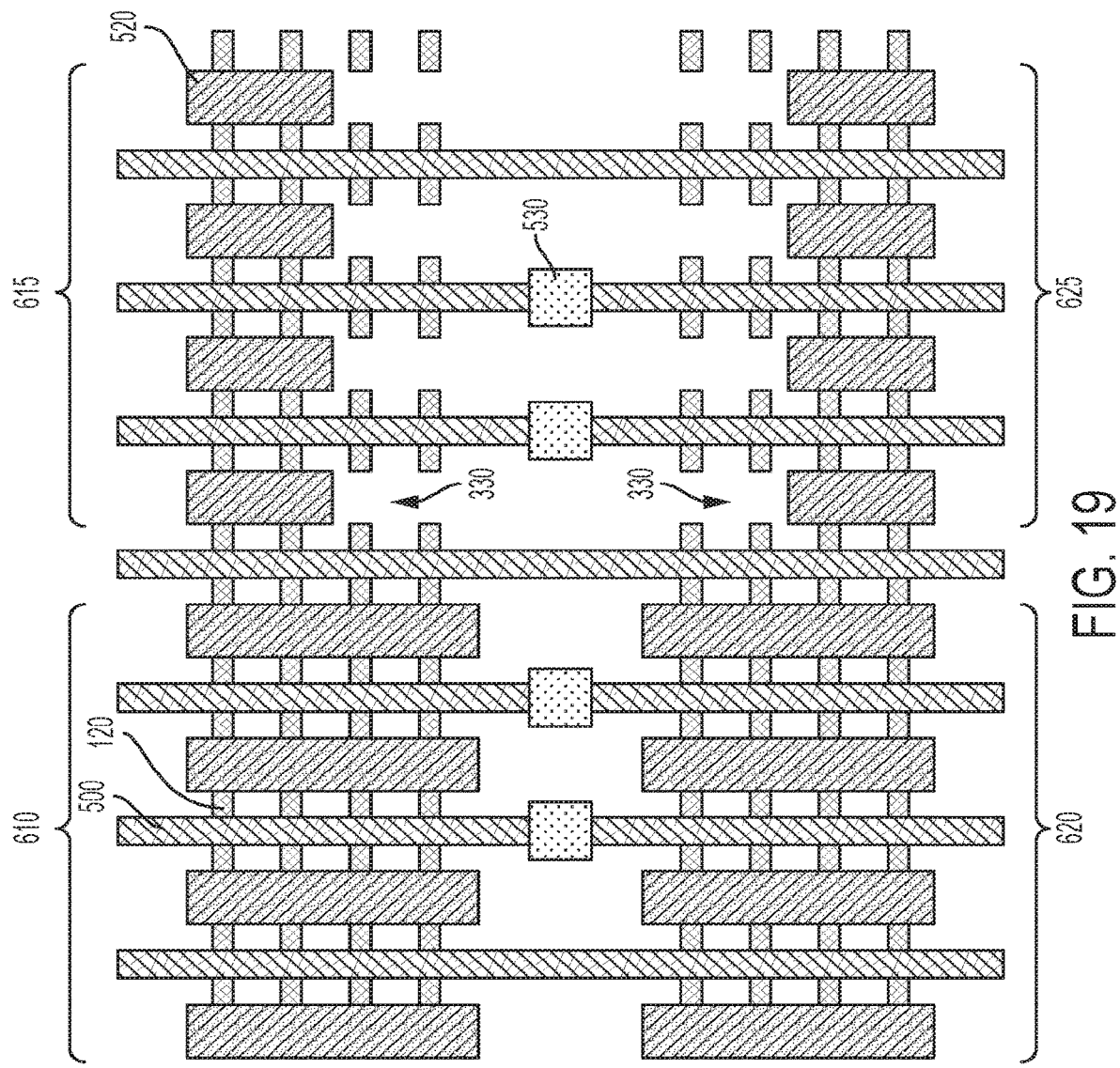
FIG. 19 is a top-down schematic plan view diagram showing a tapered device architecture, including a four fin device located within the first device region and an adjacent two fin device located within the second device region.

Referring to FIG. 19, shown is a schematic top-down plan view layout of a FinFET device architecture according to the present embodiment. The tapered device architecture includes a plurality of semiconductor fins 102 arrayed over a semiconductor substrate (not shown).

In the illustrated embodiment, each of first and second device regions 610, 620 includes a four-fin device, such as a PFET device and an NFET device, respectively. Fins 120 from the first and second device regions extend laterally into third and fourth device regions 615, 625, where selected fins have been cut and the remaining fins form two-fin devices. The fin cut openings 330 within the third and fourth device regions are aligned to the source/drain contacts 520, which overlie source/drain junctions.

As will be readily apparent to those skilled in the art, the methods and structures disclosed herein may be employed in manufacturing a variety of different devices, including, but not limited to, logic devices, memory devices, etc., and the devices may he may be either PMOS or NMOS devices.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a sacrificial gate that comprises amorphous silicon include embodiments where a sacrificial gate consists essentially of amorphous silicon and embodiments where a sacrificial gate consists of amorphous silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for forming a device, comprising:
    forming a plurality of fins over a semiconductor substrate, the fins comprising source/drain regions and channel regions extending between the source/drain regions;
    forming a plurality of sacrificial gate stacks over the fins;
    forming source/drain junctions over the source/drain regions;
    forming an interlayer dielectric over the source/drain junctions;
    forming a masking layer over the interlayer dielectric and over the sacrificial gate stacks;
    forming an opening in the masking layer defining a fin cut region;
    forming a cut opening located between an adjacent pair of the sacrificial gate stacks and extending into the semiconductor substrate by selectively etching the interlayer dielectric, the source/drain junctions, and the fins within the fin cut region;
    forming a dielectric fill layer disposed within a bottom portion of the cut opening, wherein a top surface of the dielectric fill layer extends to or above a top surface of the fins and extends to a top surface of the source/drain junctions;
    forming an interlayer dielectric within a top portion of the cut opening over the dielectric fill layer; and
    replacing each of the plurality of sacrificial gate stacks within and outside of the fin cut region with a functional gate stack, wherein a pair of opposing edges of the dielectric fill layer within the cut opening are aligned with edges of a pair of the functional gate stacks within the fin cut region.

2. The method of claim 1, wherein the functional gate stack within the top portion of the cut opening directly overlies the dielectric fill layer within the bottom portion of the cut opening.

3. The method of claim 1, wherein the dielectric fill layer comprises silicon nitride.

4. The method of claim 1, wherein the pair of opposing edges are oriented perpendicular to a length direction of at least one of the plurality of fins.

5. The method of claim 1, further comprising forming a spacer layer over sidewalls of the interlayer dielectric.

6. The method of claim 5, wherein the spacer layer comprises silicon nitride.

7. The method of claim 1, wherein the dielectric fill layer extends into the semiconductor substrate a distance greater than a length of each of the plurality of fins.

8. The method of claim 1, wherein forming the plurality of fins further comprises:
    forming a first plurality of fins within a first region of the semiconductor substrate; and
    forming a second plurality of fins with a second region of the semiconductor substrate,
    wherein the cut opening is disposed within the second region of the semiconductor substrate.

9. The method of claim 1, wherein forming the plurality of fins further comprises:
    forming a first plurality of fins within a first region of the semiconductor substrate; and
    forming a second plurality of fins with a second region of the substrate,
    wherein at least one of the second plurality of fins extends into the first region.

* * * * *